(12) United States Patent
Ogino

(10) Patent No.: US 6,544,700 B2
(45) Date of Patent: Apr. 8, 2003

(54) CHARGED PARTICLE BEAM EXPOSURE METHOD

(75) Inventor: Kozo Ogino, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 119 days.

(21) Appl. No.: 09/809,113

(22) Filed: Mar. 16, 2001

(65) Prior Publication Data

US 2002/0028398 A1 Mar. 7, 2002

(30) Foreign Application Priority Data

Sep. 1, 2000 (JP) .................................... 2000-265074

(51) Int. Cl.⁷ ................................................. G03C 5/00
(52) U.S. Cl. ........................ 430/30; 430/296; 430/942
(58) Field of Search ........................... 430/30, 296, 942

(56) References Cited

FOREIGN PATENT DOCUMENTS

JP          9-199389           7/1997

*Primary Examiner*—Christopher G. Young
(74) *Attorney, Agent, or Firm*—Staas & Halsey LLP

(57) ABSTRACT

The invention is a charged particle beam exposure method, wherein exposure data having exposure pattern data is generated from pattern data, and a material is exposed accoring with the exposure data; comprising the steps of: (a) generating plural correction areas with respect to the patterns; (b) dividing a long and narrow pattern of the pattern data into a plurality of patterns; (c) determining a pattern area density within the correction areas, and revising the pattern density of the correction area according with surrounding patterns; (d) determining a main quantity of exposure for each divided pattern according with the highest corrected pattern density; (e) generating supplementary exposure patterns in the correction areas within the divided patterns with a shortage of exposure energy in the case of the main quantity of exposure. An optimum main quantity of exposure is determined for each divided pattern to reduce the number of supplementary exposure patterns.

10 Claims, 19 Drawing Sheets

Smn (Area Density)

Pattern Dividing

FIG. 11A  Single Pattern
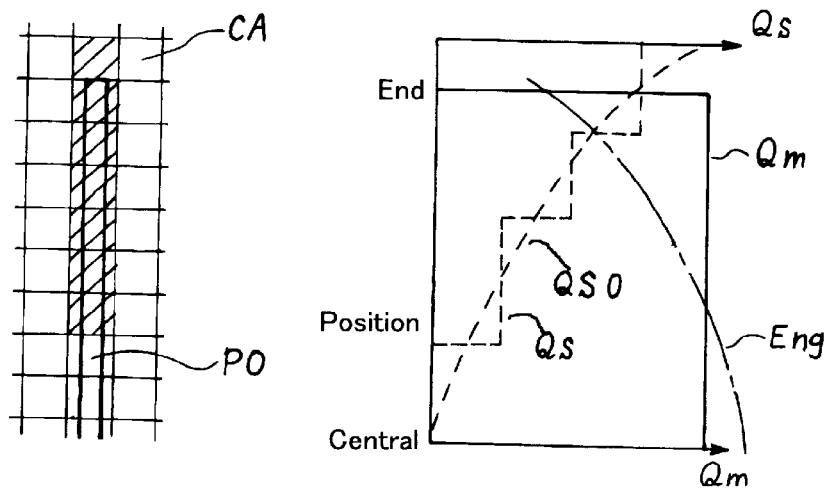
FIG. 11B  Divided Patterns
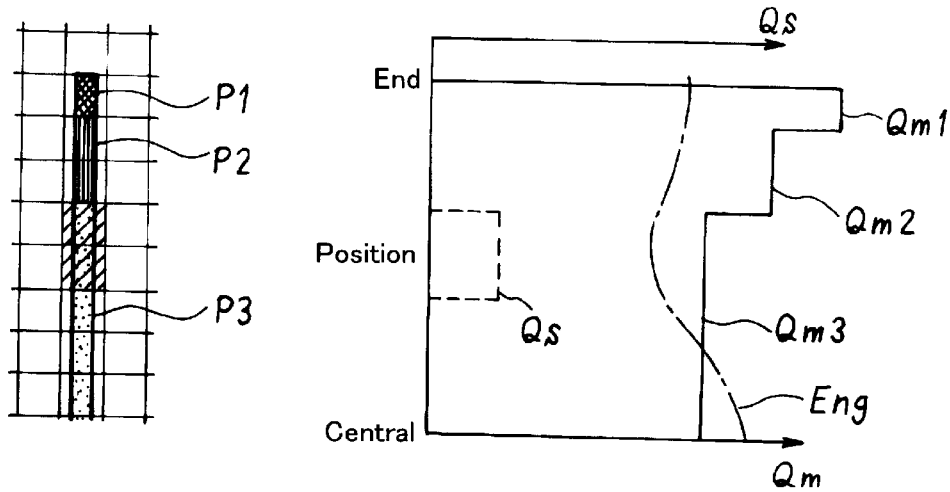

Pattern Amendment

FIG. 14A  Comparative Example 1
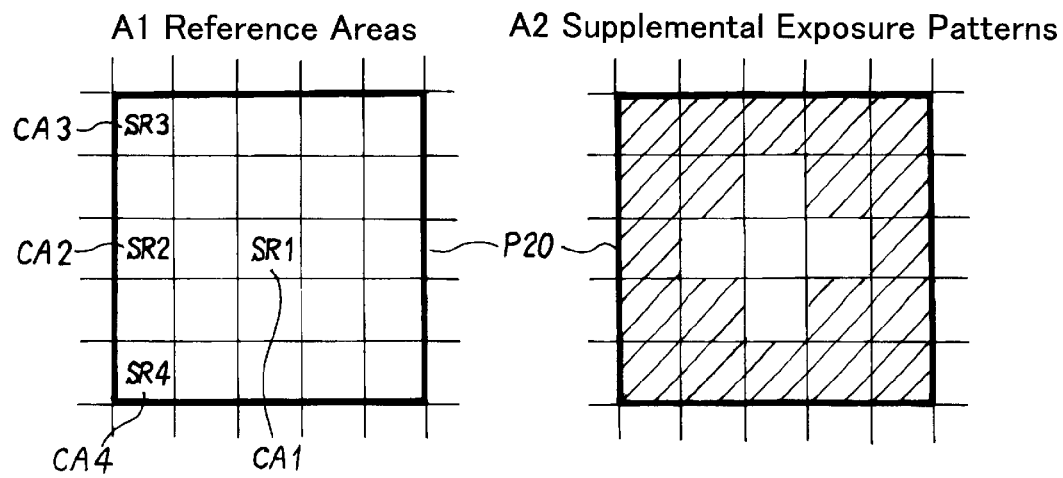
FIG. 14B  Comparative Example 2
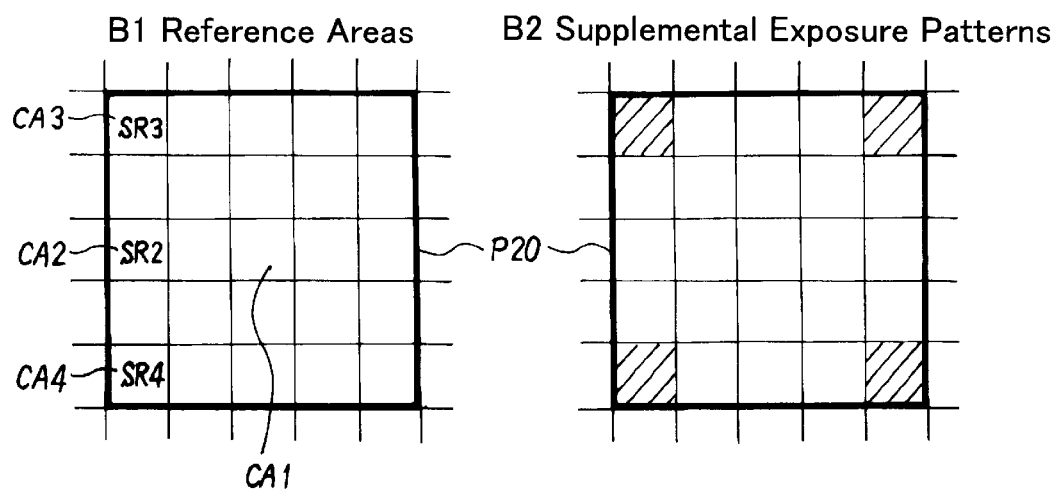

CHARGED PARTICLE BEAM EXPOSURE METHOD

BACKGROUND OF THE INVENTION

1. Field of the Invention

The present invention relates to a charged particle beam exposure method and a charged particle beam exposure apparatus, and more particularly, to a method for creating exposure data for exposing patterns on a semiconductor wafer by means of a charged particle beam, such as an electron beam, and a charged particle beam exposure apparatus for implementing this method.

2. Description of the Related Art

The exposure of a charged particle beam, such as an electron beam, is able to expose patterns of the sub-micron order and is used in the fabrication of highly integrated LSIs. In particular, recently, in addition to its use in forming masks, methods whereby the charged particle beam is irradiated and exposed directly onto the resist formed on a semiconductor wafer have been used.

In the design stage for LSIs, pattern data for a multi-layered structure is created in order to form a desired integrated circuit. The resist on a semiconductor wafer or the resist on a mask substrate is exposed in accordance with this pattern data. A charged particle beam is irradiated onto the resist layer, and the energy of the beams causes the resist to undergo a chemical reaction.

In this case, it is important to take note of the proximity exposure effect, which is caused by forward or backward scattering of the beam in the resist when the charged particle beam is irradiated onto the resist. The proximity exposure effect is a phenomenon whereby the energy of a charged particle beam irradiated onto a particular region is caused to spread into adjacent regions due to scattering of the beam. For example, in a region where the exposure pattern density is high, after developing, a pattern may have broadened due to the effect of beam energy from a charged particle beam irradiated onto an adjacent exposure pattern region. Alternatively, in a region where the exposure pattern density is low, there will be no effect due to energy from adjacent regions, and hence the pattern after developing will be condensed or narrow. A further alternative is that Coulomb interaction, which is a type of forward scattering, will give rise to blurring of the beam, in turn leading to a decline in pattern accuracy.

Therefore, it is necessary to correct the designed exposure data, by taking this proximity exposure effect into consideration. The present applicants have proposed such a method for correcting exposure data in Japanese Patent Application H9-269081, dated Oct. 1, 1997 (laid-open number H11-111595, dated Apr. 23, 1999), or U.S. Pat. No. 6,087,052, dated Jul. 11, 2000.

Briefly stated, in the methods proposed in these patent applications, a plurality of correction areas are generated in a sub-field, the pattern density in each of these correction areas is corrected in accordance with the effects due to the pattern densities in surrounding correction areas so that an corrected pattern density is determined which takes the proximity exposure effect into account, the main quantity of exposure (exposure intensity) for the pattern containing the correction areas is corrected, and furthermore, supplementary exposure patterns are generated for correction areas where the quantity of exposure is insufficient.

According to this method, the main quantity of exposure applied to each pattern is provisionally corrected by taking account of the proximity exposure effect from exposure of adjacent areas, and then supplementary exposure is performed with respect to regions within the pattern where the pattern density is low and which have not been provided with sufficient exposure energy to convert the resist. By adjusting the main quantity of exposure, broadening of the pattern due to excessive quantity of exposure is prevented, and furthermore, by performing supplementary exposure, narrowing of the end sections of the pattern, and the like, due to insufficient quantity of exposure, can be prevented.

However, a first problem lies in the fact that additional generation of supplementary exposure patterns requires new beam shot operations, thereby increasing the total number of beam shots required to fabricate an LSI, and hence causing a decline in throughput.

A second problem relates to the fact that the supplementary exposure patterns are exposure patterns having a relatively low quantity of exposure, which are appended in cases where the main quantity of exposure for the pattern is insufficient. Therefore, in many cases, these supplementary exposure patterns are required at the periphery or end sections of a pattern, where the proximity exposure effect from adjacent areas is small.

When exposing supplementary exposure patterns having a low quantity of exposure of this kind at the corner sections of a pattern, or at the end sections of a long and narrow pattern, regions receiving low exposure energy spread at these corner sections and end sections, and hence cause a decline in the contrast of the developed pattern at the corner sections and end sections, after exposure. In other words, the cross-section of the developed pattern tends to form a hem shape at the corner sections and end sections, and in plan view, it tends to have a rounded shape. Therefore, it has been sought to reduce as far as possible the generation of supplementary exposure patterns at the corner sections and end sections of a pattern.

A third problem is that the electrons in the irradiated beam are subject to a degree of spreading, due to Coulomb interaction of the electrons, when the charged particle beam is irradiated. More specifically, blurring of the irradiation beam occurs. This blurring of the beam is of significant magnitude in pattern design rules involving magnitudes of no more than 0.1 $\mu$m, in particular. Therefore, it has become necessary to perform pattern correction in a suitable manner which takes account of blurring of the beam.

SUMMARY OF THE INVENTION

Therefore, it is an object of the present invention to provide a charged particle beam exposure method and apparatus, whereby the number of supplementary exposure patterns can be reduced as far as possible.

It is a further object of the present invention to provide a charged particle beam exposure method and apparatus, whereby generation of supplementary exposure patterns at the end sections of long and narrow patterns can be restricted as far as possible.

It is yet a further object of the present invention to provide a charged particle beam exposure method and apparatus, whereby decline in exposure pattern accuracy due to blurring of the beam can be prevented.

In order to achieve the aforementioned objects, a first aspect of the present invention is a charged particle beam exposure method, wherein exposure data having exposure pattern data is generated from pattern data having a plurality of patterns, and a material is exposed in accordance with the exposure data; comprising the steps of: (a) generating a plurality of correction areas with respect to the patterns; (b) dividing a pattern of the pattern data which is long and narrow and has a height to width ratio greater than a reference value, into a plurality of patterns; (c) determining a pattern area density within the correction areas, and revising the pattern density of the correction area in accordance with the pattern densities of correction areas surrounding said correction area and the distance between the respective correction areas; (d) determining a main quantity of exposure for each divided pattern in accordance with the highest corrected pattern density of the corrected pattern densities of the correction areas intersecting with the divided pattern; (e) generating supplementary exposure patterns in the correction areas within the divided patterns where there is a shortage of exposure energy in the case of the main quantity of exposure; and (f) exposing the material, in accordance with exposure pattern data comprising the supplementary exposure patterns added to the pattern data.

According to this first aspect of the present invention, long and narrow patterns are divided into a plurality of patterns, and the optimum main quantities of exposure are determined for each of these divided patterns. In regions where there is a shortage of exposure energy with this main quantity of exposure, a supplementary exposure pattern is generated and the exposure shortage is resolved. Since an optimum main quantity of exposure is determined for each divided pattern, it is possible to reduce the number of supplementary exposure patterns required.

Furthermore, in order to achieve the aforementioned objects, a second aspect of the present invention is a charged particle beam exposure method, wherein exposure data having exposure pattern data is generated from pattern data having a plurality of patterns, and a material is exposed in accordance with the exposure data; comprising the steps of: (a) determining blurring of the beam due to spreading of the beam according to the maximum size of the exposure beam size used to draw the pattern, and amending the pattern to be reduced in accordance with the blurring of the beam; and (b) exposing the material in accordance with exposure pattern data determined in accordance with the amended pattern.

According to this second aspect of the present invention, the blurring of the beam due to Coulomb interaction is determined in accordance with the beam size used to draw the patterns, and the patterns are amended to be reduced in size according to this blurring of the beam. Therefore, the pattern accuracy after exposure and development is improved.

In order to achieve the aforementioned objects, a third aspect of the present invention is a charged particle beam exposure method whereby exposure data having exposure pattern data is generated from pattern data having a plurality of patterns, and a material is exposed in accordance with the exposure data; comprising the steps of: (a) generating a plurality of correction areas with respect to the patterns; (b) determining a pattern area density within the correction areas, and revising the pattern area density of said correction area in accordance with the pattern area densities of correction areas surrounding said correction area and the distance between the respective correction areas; (c) determining a main quantity of exposure for each pattern in accordance with the highest corrected pattern area density of the corrected pattern area densities of the correction areas intersecting with the boundaries of the pattern; (d) generating supplementary exposure patterns in the correction areas within the patterns where there is a shortage of exposure energy in the case of the main quantity of exposure; and (e) exposing the material, in accordance with exposure pattern data having the supplementary exposure patterns added to the pattern data.

According to this third aspect of the present invention, the main quantity of exposure for the patterns is corrected with reference to the highest corrected pattern area density in the correction areas intersecting with the pattern boundaries. This highest corrected pattern density is generally called the pattern area density and is the representative area density of the pattern. According to this method, it is possible to set the main quantity of exposure for the pattern to the optimum quantity of exposure for the pattern boundaries. Therefore, the number of supplementary exposure patterns generated at the pattern boundaries can be reduced.

In order to achieve the aforementioned objects, a fourth aspect of the present invention is a charged particle beam exposure method for exposing a material by means of a charged particle beam transmitted through a block mask having a plurality of patterns, comprising the steps of: (a) generating a plurality of correction areas with respect to patterns of the block mask; (b) determining a pattern area density within the correction areas, and revising the pattern density of said correction area in accordance with the pattern densities of correction areas surrounding said correction area and the distance between the respective correction areas; (c) determining quantities of exposure for each pattern in accordance with the highest corrected pattern density of the corrected pattern densities of the correction areas intersecting with the boundaries of the patterns, and setting the smallest quantity of exposure among the quantities of exposure for the plurality of patterns within the block mask as the main quantity of exposure for the block mask; (d) generating supplementary exposure patterns in the correction areas within the patterns where there is a shortage of exposure energy in the case of the main quantity of exposure; and (e) exposing the material in accordance with the main quantities of exposure by means of a charged particle beam passing through the block mask, and further exposing the material according to the supplementary exposure patterns.

According to this fourth aspect of the present invention, it is possible to optimize the quantity of exposure for a block mask.

BRIEF DESCRIPTION OF THE DRAWINGS

FIG. 11 is a diagram illustrating the relationship between main quantity of exposure and supplementary quantity of exposure, in the case of a single pattern and divided patterns;

FIG. 14 is a diagram describing quantity of exposure correction in the present embodiment;

DESCRIPTION OF THE PREFERRED EMBODIMENTS

Below, embodiments of the present invention are described with reference to the drawings. However, these embodiments do not limit the technical scope of the present invention. Furthermore, although the present invention is applied to a charged particle beam exposure method and an apparatus for same, the following embodiments are described using the example of an electron beam exposure method and apparatus.

Figure 1:
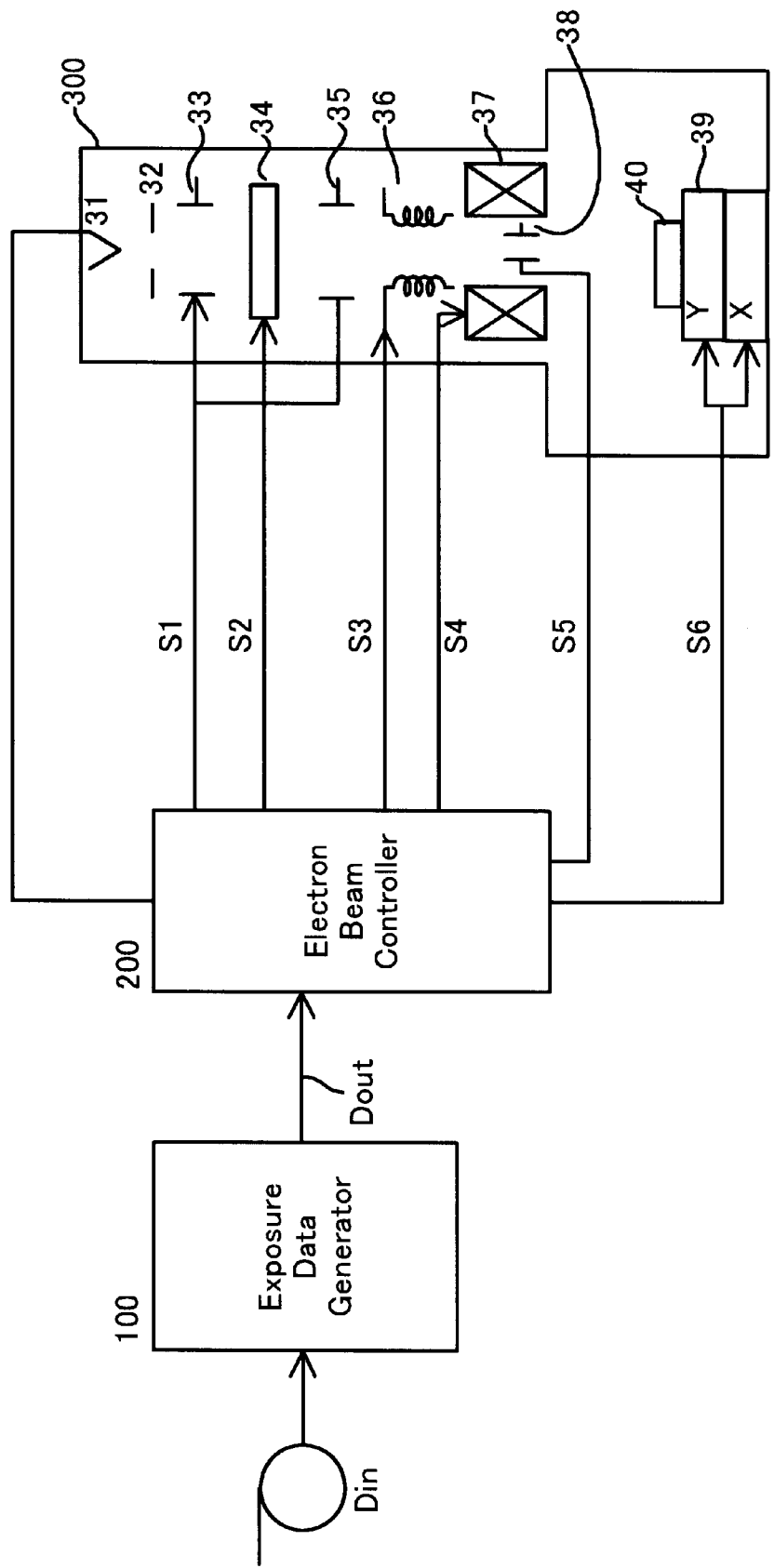
FIG. 1 is a diagram outlining the configuration of an electron beam exposure apparatus according to the present embodiment.

FIG. 1 is a diagram outlining the configuration of an electron beam exposure apparatus according to the present embodiment. In this example, the electron beam exposure apparatus comprises: an exposure data creating apparatus 100 which inputs design data Din containing pattern data, and outputs exposure data Dout taking the proximity exposure effect into account; an electron beam control apparatus 200 which is supplied with this exposure data Dout and controls the exposure apparatus; and a mirror barrel 300. The mirror barrel 300 contains: an electron gun 31; a rectangular transmission mask 32; a transmission mask for exposure 34, such as a block mask, or the like; mask deflectors 33, 35; a focal lens 36; an electromagnetic deflector 37; an electrostatic deflector 38; and an X, Y stage 39 whereon a wafer 40 is mounted. A rectangular beam formed by the transmission mask 32 is transmitted through a prescribed mask on the transmission mask 34 selected by mask deflectors 33, 35, and is directed by deflectors 37, 38 onto a prescribed position on the wafer 40.

The electron beam control apparatus 200 generates: a control signal S1 for the mask deflectors 33, 35; a control signal S2 which causes the transmission mask 34 to move in a horizontal direction; a control signal S3 for the focal lens 36; a control signal S4 for the electromagnetic deflector 37; a control signal S5 for the electrostatic deflector 38; and a control signal S6 for the stage.

Figure 2:
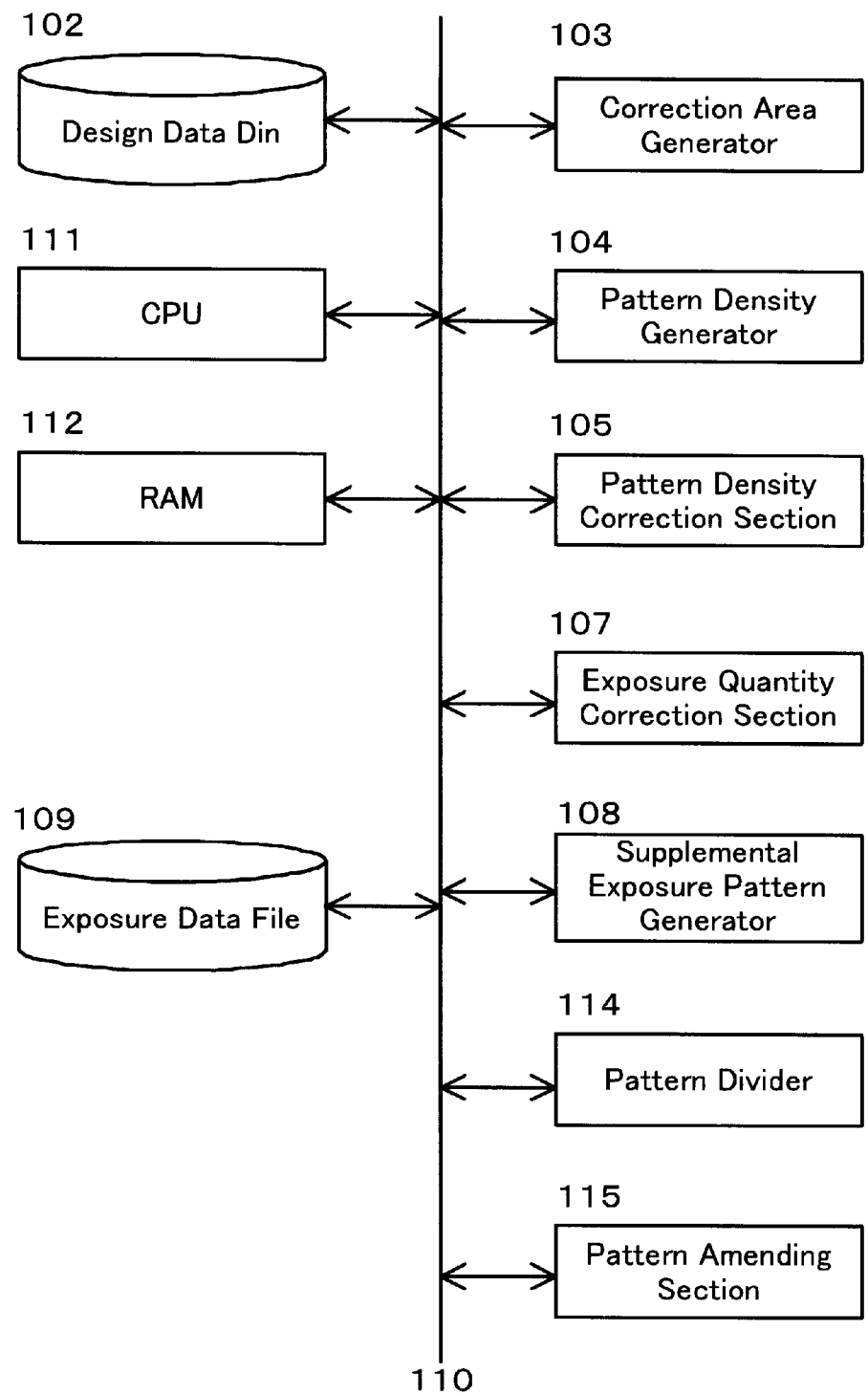
FIG. 2 is a diagram illustrating the internal configuration of an exposure data creating apparatus 100.

FIG. 2 is a diagram showing the internal composition of the aforementioned exposure data creating apparatus 100, which comprises: a design data file 102 for storing design data Din as pattern data; a correction area generating section 103 for generating correction areas within sub-field regions; a pattern density generating section 104 for calculating the pattern density within a correction area; a pattern density correcting section 105 for correcting the pattern density within a correction area by taking the effects between correction areas into account; an exposure quantity correcting section 107 for taking the maximum pattern density of the pattern densities of the correction areas covered by the pattern as the pattern area density (reference area density) and for correcting the main quantity of exposure for the pattern according to this pattern area density; a supplementary exposure pattern generating section 108 for generating supplementary exposure patterns in correction areas where exposure is insufficient, in accordance with the main quantity of exposure of the pattern and a corrected pattern density for the correction area; and an exposure data file 109 for storing exposure data. The exposure data creating apparatus 100 also comprises a pattern dividing section 114 for dividing up long and narrow patterns, wherein the ratio h/w of height h to width w is greater than a prescribed reference value, according to an algorithm described hereinafter, and a pattern amending section 115 for compressing a pattern by taking into account blurring of the beam due to Coulomb interaction of the electron beam. These various elements are connected to a calculating section 111 by means of a bus 110.

[Summary of method for generating exposure data]

Figure 3:
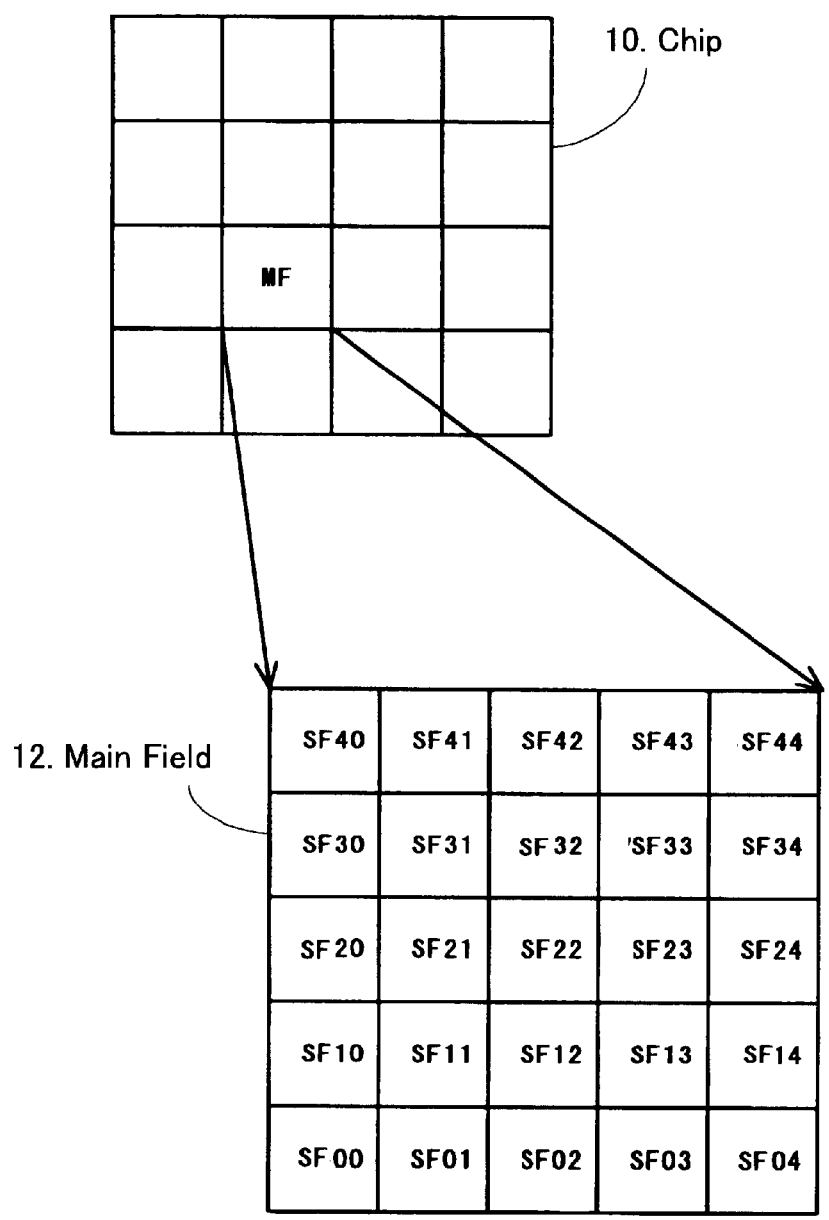
FIG. 3 is a diagram showing the relationship between a main-field MF and sub-fields SF in a semiconductor chip 10.

Below, a summary of a method for generating exposure data from design data is described. FIG. 3 is a diagram illustrating the relationship between a main field MF and sub-fields SF in a semiconductor chip 10. Generally, a plurality of semiconductor chips 10 are formed on a semiconductor wafer. FIG. 3 shows the relationship between a main field and sub-fields in a semiconductor chip 10 of this kind. In the exposure apparatus shown in FIG. 1, the electron beam deflectors comprise an electromagnetic deflector 37, which has a slow response speed but a large range of deflection, and an electrostatic deflector 38, which has a rapid response speed but a narrow range of deflection. The main field MF is a region onto which the beam can be deflected by means of the electromagnetic deflector 37, and the sub-fields SF are regions onto which the beam can be deflected by means of the electrostatic deflector 38.

A wafer is moved to the middle of a desired main field MF by driving the X, Y stage 39 of the exposure apparatus, the electron beam is deflected within this main field MF to the desired sub-field by means of the electromagnetic deflector 37, and the electron beam formed to a desired shape is further deflected by means of the electrostatic deflector 38 and irradiated onto a desired position within the sub-fields. In the example in FIG. 3, a single main field 12 is divided into sub-fields SF00–SF44 in a five-row, five column configuration.

The sub-fields SF comprise sub-fields having mutually different patterns, and sub-fields having the same pattern, which are positioned by repetition. The repeatedly positioned sub-fields closely resemble memory cell regions in a memory device, for example. On the other hand, the sub-fields having mutually different patterns closely resemble peripheral circuits, logic circuits, or the like. In this way, the chip 10 is divided into a plurality of main fields, and a plurality of sub-fields within each of these main fields, and the design data Din contains the pattern data present in each respective sub-field.

Incidentally, the sub-fields do not necessarily have to be configured strictly without any overlapping or gaps, as depicted in FIG. 3, but rather, they may overlap partially, or gaps may be present therebetween.

Figure 4:
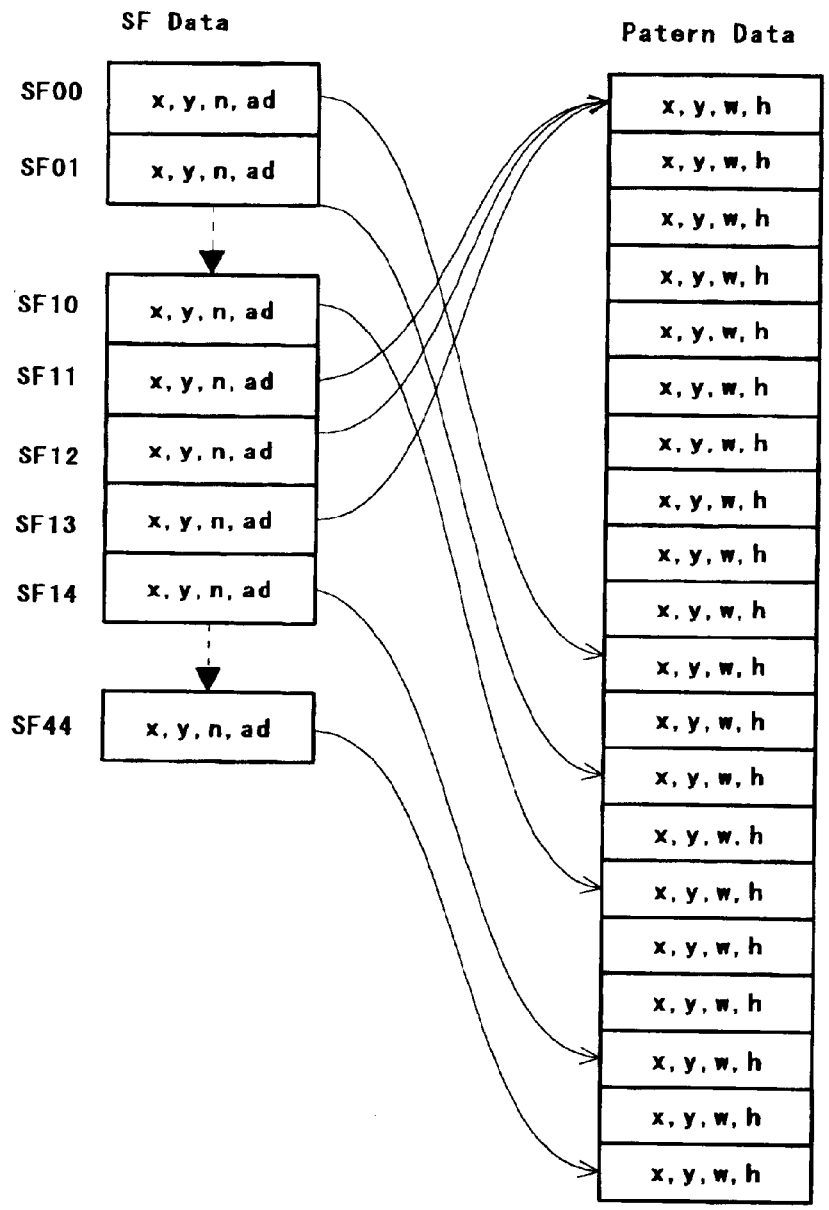
FIG. 4 is a diagram showing an example of the configuration of design data relating to a sub-field within a main field 12.

FIG. 4 is a diagram showing an example of the composition of design data relating to the sub-fields in the main field 12 shown in FIG. 3. In this example, the data for sub-fields SF00–SF44 respectively comprises the central coordinates (x,y) of the sub-field, a pattern number n, and a pattern address ad. In this example, the sub-field data is arranged in the order of the sub-fields within the main field 12: SF00, SF01, . . . SF11, SF12, . . . , SF44.

The pattern data, on the other hand, comprises the bottom left co-ordinates of the pattern (x,y), and the width w and height h of the pattern, for example. The address ad within the sub-field data region indicates an address in the pattern data, and the patterns in the pattern number n of address regions, counting consecutively from this address ad, represent the pattern data within that respective sub-field.

Therefore, the data for the sub-fields SF00, SF01 having mutually different patterns comprises mutually different pattern data addresses, whilst the data for the repeatedly positioned sub-fields SF10 to SF13 comprises pattern data addresses which are the same as each other.

Figure 5:
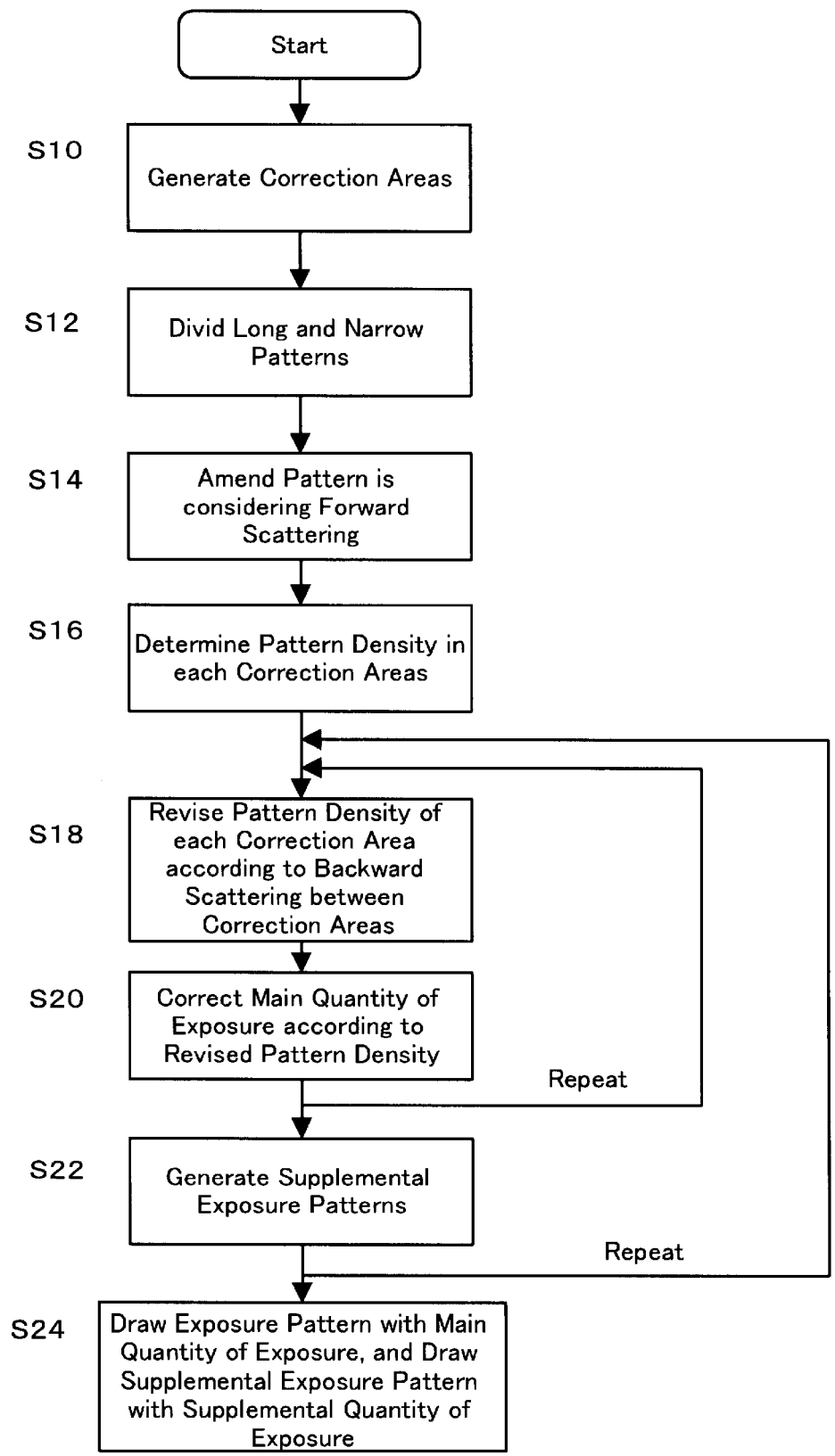
FIG. 5 is a flowchart of exposure steps including creation of exposure data.
Figure 6:
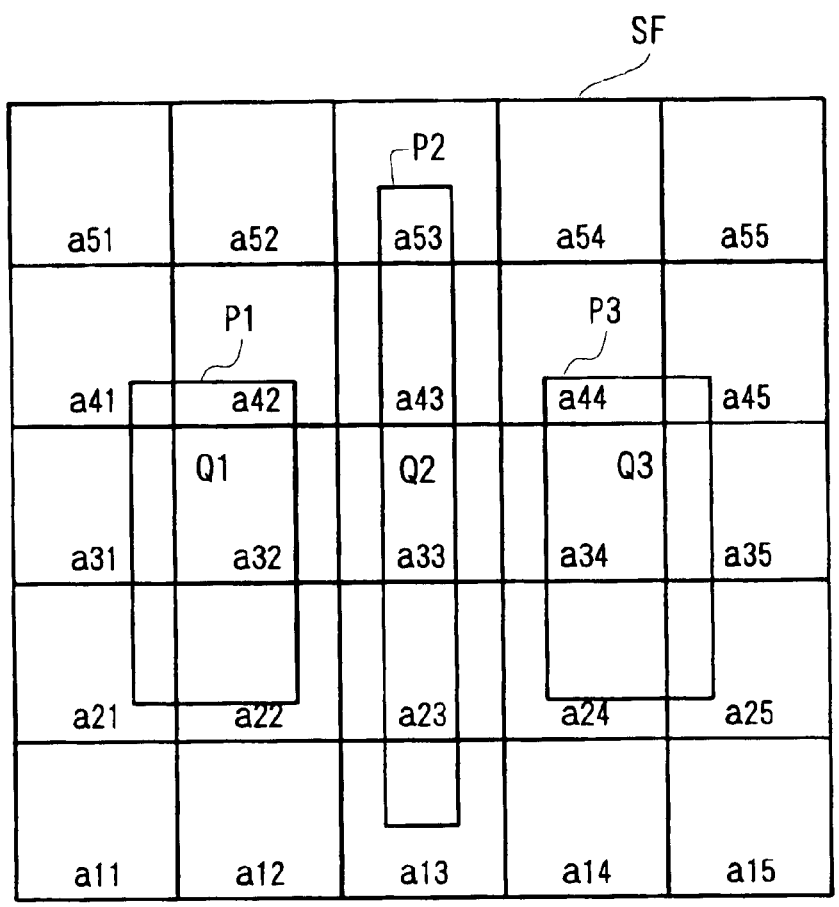
FIG. 6 is a diagram illustrating one example of a sub-field SF and of correction areas located thereon.

FIG. 5 is a flowchart of exposure steps including the creation of exposure data. FIG. 6 is a diagram showing one example of a sub-field SF. A method for creating exposure data is now described with reference to the sub-field example in FIG. 6.

As a prerequisite, a default main quantity of exposure Qm is set for each pattern. This main quantity of exposure Qm is set as a basic quantity of exposure, for example. The set main quantity of exposure Qm is appended to the respective pattern data. There are various methods for setting this main quantity of exposure Qm, according to the shape of the pattern, but this does not form an essential part of the present embodiment, and hence description thereof is omitted here.

The design data only contains the patterns that are to be formed on the resist layer of the wafer. However, when an electron beam is irradiated onto the resist layer on the wafer, regions of high pattern density will receive a large amount of beam energy due to proximity exposure effects. On the other hand, regions of low pattern density are not subject to proximity exposure effects and hence are exposed to a lower beam energy. Therefore, the main quantity of exposure corresponding to the design data pattern is revised, taking the aforementioned proximity exposure effects into account, and where necessary, supplementary exposure is conducted to improve the accuracy of the developed pattern shape. In the present embodiment, in order to generate exposure data on the basis of the design data, mesh-shaped correction areas which are smaller than the sub-fields are generated on the whole surface of the chip (S10), as illustrated in FIG. 6. Thereupon, the aforementioned main quantity of exposure is corrected and supplementary exposure patterns are generated, on the basis of the pattern area density within the correction areas.

Moreover, in the present embodiment, long and narrow patterns, wherein the h/w ratio of height h to width w exceeds a prescribed reference value, are divided up in the longer direction thereof, by means of an algorithm described hereinafter (S12). More specifically, the end sections of long and narrow patterns are divided to create a plurality of pattern data. In conjunction with this, the corrected main quantity of exposure is assigned respectively to the divided patterns, whereby a more suitable main quantity of exposure is assigned to the pattern end sections and hence occurrence of supplementary exposure patterns at these end sections can be suppressed.

Furthermore, in the present embodiment, pattern amendment is performed to reduce the pattern size by taking beam spreading (blurring of the beam) due to Coulomb interaction of the electron beam into account (S14). In the present embodiment, as described hereinafter, blurring of the beam is detected according to the size of the beam used to draw a pattern, and the pattern size is reduced in accordance with the detected blurring of the beam.

The sub-field SF shown in FIG. 6 contains the patterns P1, P2 and P3. Main quantities of exposure Q1, Q2, Q3 are initially set for the patterns P1, P2, P3, respectively. Moreover, the sub-field SF also contains a five row by five column configuration of correction areas a11–a55. These correction areas are generated by a correction area generating section 103 as illustrated in FIG. 2. The method for generating the correction areas involves disposing regions of a prescribed size in a matrix fashion, using the chip origin as a reference point, for example.

In the example in FIG. 6, pattern P1 positions at correction areas a21, a22, a31, a32, a41, and a42. Pattern P2 positions at correction areas a13, a23, a33, a43 and a53, and pattern P3 positions at correction areas a24, a25, a34, a35, a44 and a45.

Figure 7:
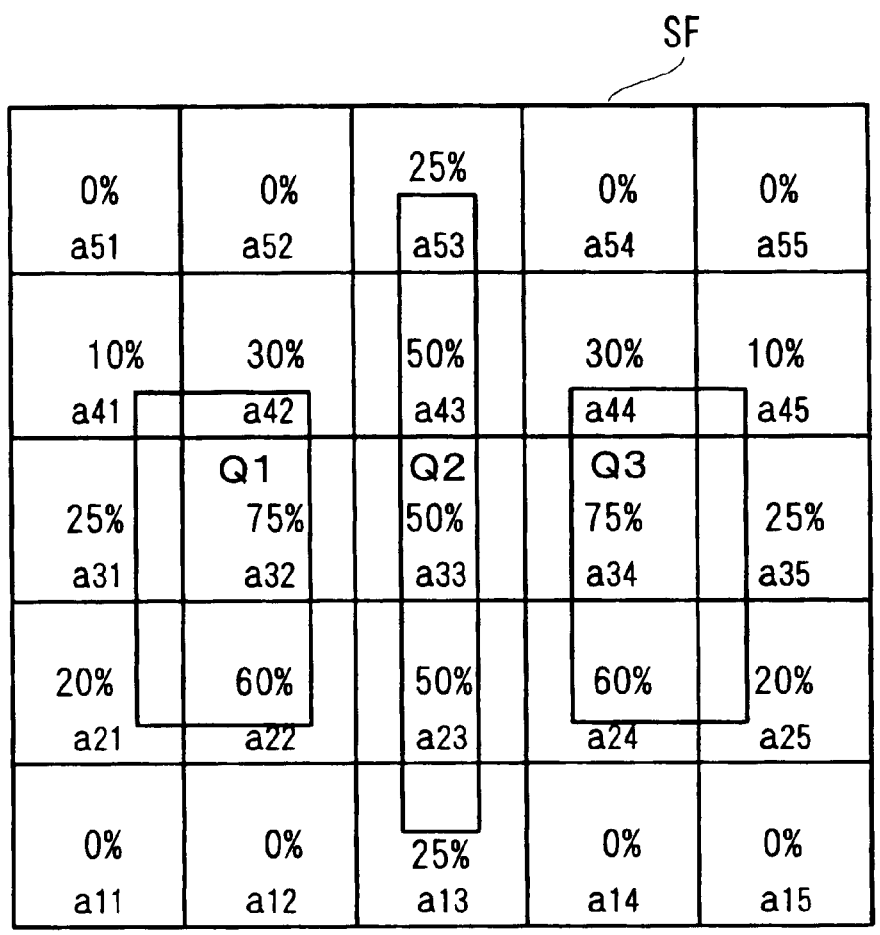
FIG. 7 is an example showing the pattern density Smn for each correction area of the sub-field example in FIG. 6.

Thereupon, at step S16, the pattern density in each correction area is determined. Specifically, the pattern density is found by the pattern density generating section 104 shown in FIG. 2. FIG. 7 depicts an example where figures for pattern density Smn have been input for each correction area existing in the sub-field shown in FIG. 6. In other words, the ratio of the pattern surface area to the correction area surface area (namely, the pattern density) in correction areas a32, a34, and the like, is a high value of 75%, whilst the pattern density in correction area a11, or the like, where there is no pattern, is 0%.

Next, at step S18, the pattern density in each correction area is revised according to the proximity exposure effect between correction areas. This revision of the pattern density is performed by the pattern density correcting section 105 in FIG. 2. According to the proximity exposure effect, the energy from the electron beam irradiated onto patterns in correction areas surrounding a certain correction area in question creates an effect on that correction area in accordance with the distance between the areas. Thus, the effect is stronger from more closely positioned correction areas and weaker from more distantly positioned correction areas. Therefore, in the present embodiment, a coefficient β(r) (where r is the distance between areas), which is in approximately inverse proportion to the distance, is previously determined, the product of the pattern density Smn of a surrounding correction area and the quantity of exposure thereof is multiplied by this coefficient β(r), and the result is added to the pattern density of the correction area in question, whereupon, it is finally divided by the quantity of exposure for the correction area in question.

When the pattern densities of the respective correction areas are revised in this manner, the quantities of exposure for the respective patterns P1, P2, P3 are corrected on the basis of the corrected pattern density SRmn (S20). In this process, the correction area having the highest corrected pattern density SRmn of the plurality of correction areas within the pattern is detected, and a main quantity of exposure Qm is determined in such a manner that the exposure energy as calculated from this corrected pattern density (reference area density of pattern or pattern area density) becomes the image resolution level. Consequently, the main quantity of exposure for each pattern is corrected, thereby preventing problems such as spreading of the pattern due to the main quantity of exposure being too high, or constriction of the pattern due to the quantity of exposure being too low.

Correction of the main quantity of exposure for the pattern also produces variations in the effects received from surrounding correction areas, as taken into account at step S18, and therefore, desirably, steps S18 and S20 are performed repeatedly until they converge to a certain extent, as illustrated in FIG. 5.

In the present embodiment, as described hereinafter, when correcting the main quantity of exposure, the main quantity of exposure is corrected in accordance with the highest corrected pattern density of the correction areas positioned at the boundary of the pattern. Thereby, even in the case of long and narrow patterns, such as line and space patterns, or the like, or the case of large patterns which cover a plurality of correction areas, it is possible to revise the main quantity of exposure to an optimum value, and hence to reduce the number of supplementary exposure patterns generated.

Thereupon, depending on the main quantity of exposure given for each pattern, shortages in the quantity of exposure arise at the corner sections and end sections of the patterns. In other words, if the exposure energy for a correction area whose pattern density has been revised at step S18 is lower than the image resolution level, then the proximity exposure effect will be low and hence a quantity of exposure shortage will arise and it will not be possible to convert the resist. In order to perform supplementary exposure for such a correction area, a supplementary exposure pattern is generated and appended to the exposure data (S22). In this case, a minimum value is previously determined for the supplementary quantity of exposure, in such a manner that no supplementary exposure patterns are produced which have a quantity of exposure below the minimum value and has hardly any effect on the dimensional accuracy of the developed pattern. Here, a supplementary exposure pattern is an exposure pattern used to supply energy corresponding to a proximity exposure effect to regions having low exposure energy, and it has a uniform low quantity of exposure of the order of several %, for example, of the exposure energy. Desirably, the size of a supplementary exposure pattern is of the order of the size of the correction areas. However, the positions of the supplementary exposure patterns do not necessarily have to be the same as the correction areas generated for revising the pattern density. Naturally, they may also be the same.

Figure 8:
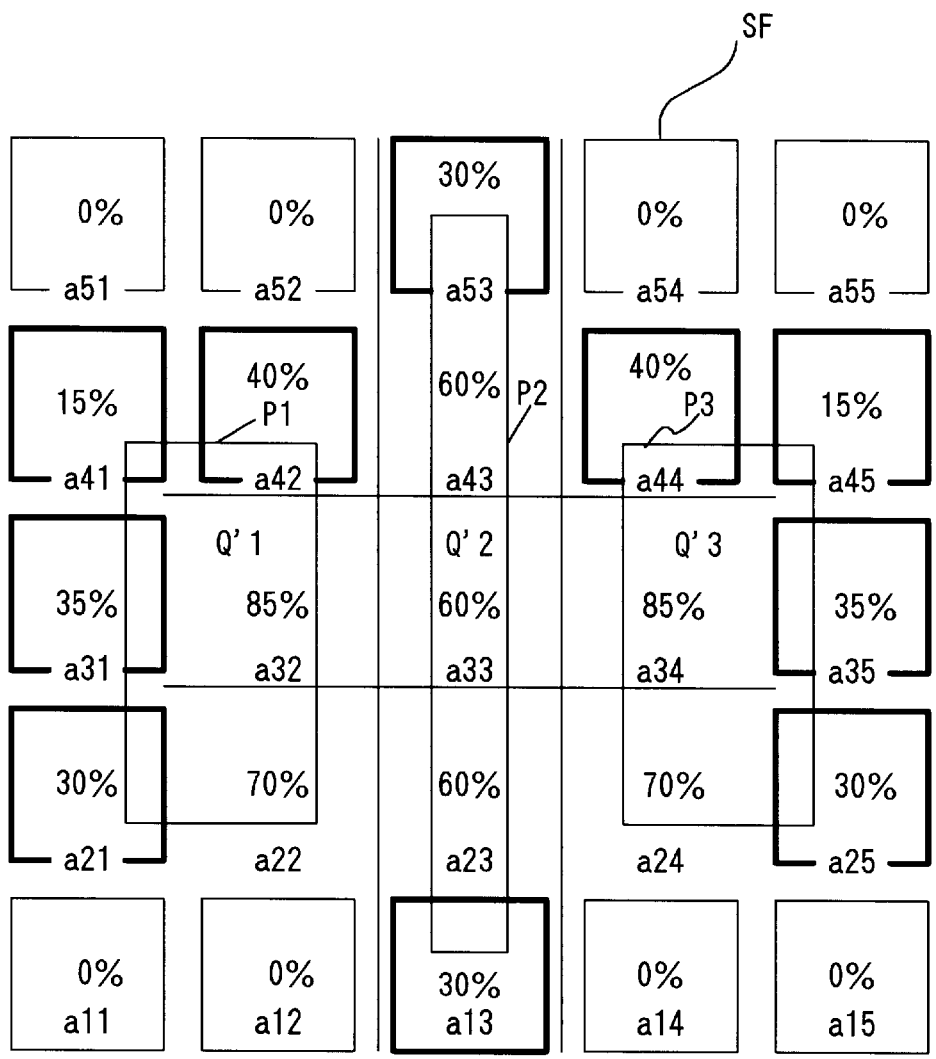
FIG. 8 is a diagram illustrating a sub-field after main quantity of exposure correction and generation of supplementary exposure patterns.

FIG. 8 is a diagram showing the result of correcting the main quantity of exposure for each pattern and generating supplementary exposure patterns (indicated by the thick lines) in correction areas where a pattern exists but the exposure energy is low. In this example, the main quantities of exposure for patterns P1, P2, P3 are given by the corrected quantities of exposure Q1', Q2' Q3'. Furthermore, supplementary exposure patterns (thick lines) are also generated in the areas a13, a21, a25, a31, a35, a41, a42, a44, a45, a53, having low exposure energy.

When supplementary exposure patterns are generated, these also affect the corrected pattern densities. Therefore, desirably, the steps S18, S20 and S22 should be repeated until they converge to a certain extent, as illustrated in FIG. 5. Furthermore, by repeating these steps, the exposure energy of supplementary exposure patterns which have a quantity of exposure less than a minimum value and which are not generated, as described above, can be compensated for to some extent, by adjusting the quantity of exposure in adjacent supplementary exposure patterns.

As illustrated in FIG. 5, correction areas are generated for the whole area of the chip, the pattern densities thereof are determined, the pattern densities are corrected to account for the effect from surrounding correction areas, and main quantities of exposure Qm for the patterns are corrected and supplementary exposure patterns are generated, on the basis of these corrected pattern densities. Consequently, exposure data is created which makes it possible to increase developed pattern accuracy.

Figure 9:
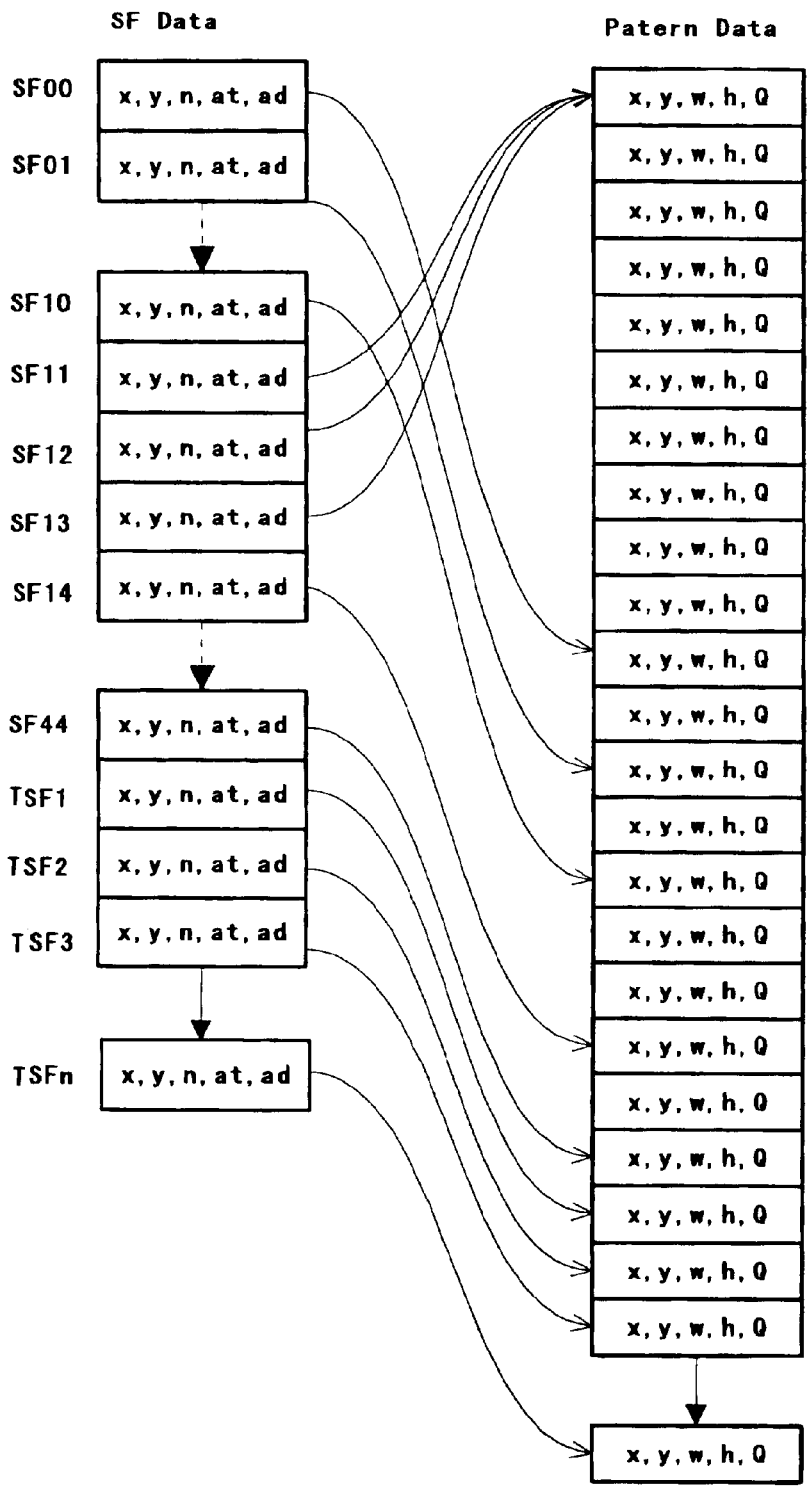
FIG. 9 is a diagram illustrating an example of the configuration of created exposure data.

FIG. 9 is a diagram illustrating an example of the composition of the created exposure data. Firstly, whereas the pattern data in the design data in FIG. 4 has positional data (x,y), width w and height h, the pattern data in the exposure data also has the quantity of exposure Q. This quantity of exposure Q is a main quantity of exposure corrected according to the ordinary pattern. Secondly, whilst the design data is constituted by the sub-fields SF00–SF44 and the pattern data contained in those sub-fields, in the exposure data, additional sub-fields are appended in the form of supplementary exposure sub-fields TSF1–TSFn having supplementary exposure patterns. A supplementary quantity of exposure Q corresponding to the shortage in the exposure energy is supplied to these supplementary exposure patterns.

The sub-fields do not necessarily have to be aligned in a single plane within a main field, as shown in FIG. 3, but rather may also comprise partially overlapping regions, depending on the exposure pattern within the sub-fields. The exposure step simply involves irradiating an electron beam onto the exposure pattern contained in each sub-field, at the respective position of the sub-field. Therefore, it is allowable to record a supplementary exposure pattern sub-field that overlaps with an exposure pattern sub-field. Thereby, the supplementary exposure pattern can be appended to the exposure data, without infringing the hierarchical data structure of the exposure data.

The exposure data Dout created in the way described above is then supplied to the electron beam control apparatus 200, and electron beam exposure is carried out in accordance with this exposure data (S24). Consequently, the pattern after exposure and developing is a pattern of high accuracy which will be closer to the design data.

[Pattern dividing method]

FIG. 10 is a diagram illustrating a pattern dividing step in the present embodiment. In the pattern dividing step according to the present embodiment, a long and narrow pattern, wherein the ratio h/w of the height h to the width w is greater than a certain reference value, is divided in the longitudinal direction thereof into a plurality of patterns. The main quantity of exposure is assigned respectively to these divided patterns. As stated previously, the main quantity of exposure for the pattern is determined in accordance with the maximum pattern density of the corrected pattern densities of the correction areas belonging to that pattern. More desirably, it is determined in accordance with the correction area having the highest pattern density within the correction areas within the boundary of that pattern.

Figure 10A:
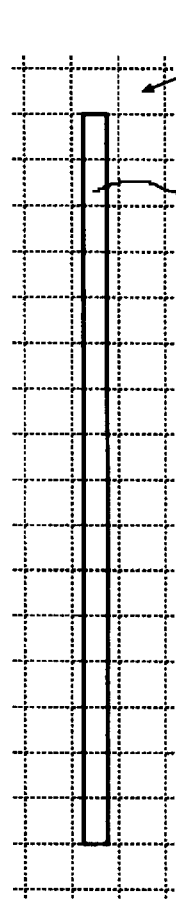
FIG. 10 is a diagram describing pattern dividing steps in the present embodiment.
Figure 10B:
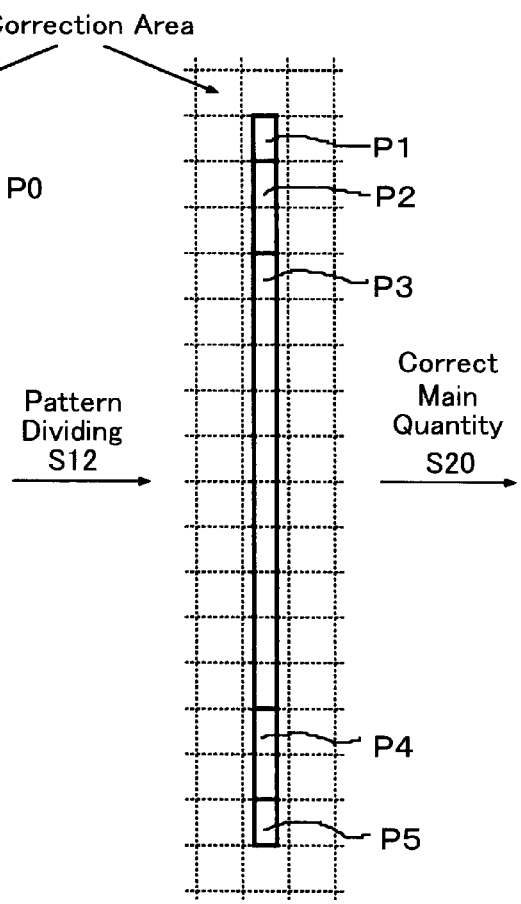

FIG. 10A shows an example of a long and narrow pattern P0 and mesh-shaped correction areas CA. In the initial design data, there is a single long and narrow pattern P0. FIG. 10B shows a state where the pattern P0 has been divided into a plurality of patterns P1–P5. In dividing the patterns, the original pattern P0 is divided into smaller regions at the end sections thereof, and into larger regions towards the central portion thereof. More desirably, it is divided into sizes of correction area units. In the example of FIG. 10B, the endmost patterns P1, P5 have a size of one correction area, the subsequent patterns P2, P4 have the size of two correction areas, and the central pattern P3 occupies the portion remaining.

Figure 10C:
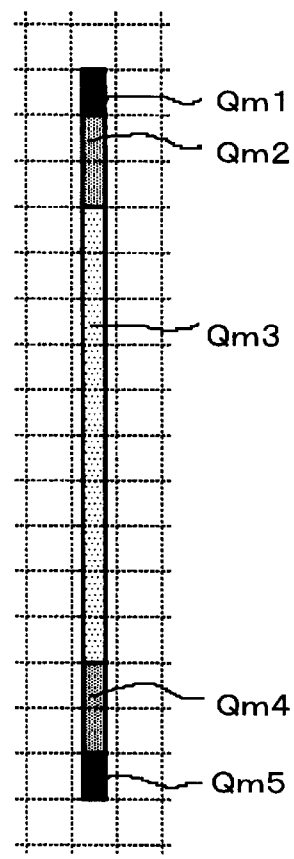

As illustrated in FIG. 10C, the corrected main quantities of exposure Qm1–Qm5 are supplied respectively to the five divided patterns P1–P5. The main quantities of exposure Qm1–Qm5 are determined according to the highest corrected pattern density (the pattern area density) of the correction areas belonging to each respective pattern. Consequently, a low main quantity of exposure is determined for patterns, such as the central pattern P3, having a high corrected pattern density, and a high main quantity of exposure is determined for patterns, such as the end patterns P1, P5, having a low corrected pattern density. Consequently, it is possible to reduce the number of supplementary exposure patterns compared to a case where a single main quantity of exposure is provided for the whole pattern P0.

FIG. 11 is a diagram showing the relationship between the main quantity of exposure and supplementary quantity of exposure for a single pattern and for divided patterns. FIG. 11A shows the relationship between the main quantity of exposure and supplementary quantity of exposure in a case where a single main quantity of exposure Qm is supplied to a single pattern P0. A pattern P0 and correction areas CA are illustrated in the plan view on the left-hand side of the diagram, and the main quantity of exposure Qm and the supplementary quantity of exposure Qs are depicted with respect to position (vertical axis) on the right-hand graph. The positions on the right-hand graph correspond to the positions of the left-hand plan view.

In the case of the single pattern P0 in FIG. 11A, a single main quantity of exposure Qm is supplied. Therefore, the same main quantity of exposure Qm is applied to both the central region and the end sections of the pattern P0. However, due the proximity exposure effect, the exposure energy Eng actually supplied is greater in the central region where the pattern density is high and is lower in the end sections where the pattern density is low, as illustrated in the diagram. Therefore, an exposure shortage arises at the end sections.

Therefore, a supplementary quantity of exposure Qs0 is required, as indicated by the broken lines. This supplementary quantity of exposure Qs0 is large at the end sections of the pattern, and it gradually reduces towards the central portion. Moreover, the change in the required supplementary quantity of exposure Qs0 reduces rapidly at the end sections and declines more gradually towards the central portion. However, the actual supplementary exposure patterns are set in units of the size of the correction areas, and the actual supplementary quantity of exposure Qs is set in a stepshaped fashion, as shown by the another broken line. The obliquely shaded section of the plan view shows a supplementary exposure pattern. In other words, supplementary exposure is performed in six correction areas from the pattern end sections, and the quantity of exposure Qs reduces gradually from the end section thereof.

Therefore, if the end sections of the pattern are divided into a plurality of patterns, as illustrated in FIG. 10, it is possible to set individual main quantities of exposure Qm respectively for each divided pattern. FIG. 11B shows the relationship between main quantity of exposure and supplementary quantity of exposure in the case of divided patterns. At the aforementioned quantity of exposure correcting step, it is expected that the corrected pattern density for the end pattern P1 will be relatively low, the corrected pattern density of the next pattern P2 will be relatively high, and the corrected pattern density of the pattern P3 in the central region will be the highest. Therefore, in quantity of exposure correction, the exposures will be corrected so that the main quantity of exposure Qm1 for the end pattern P1 will be highest, the main quantity of exposure Qm2 for the next pattern P2 will be lower, and the main quantity of exposure Qm3 for the pattern P3 in the central region will be the lowest. Consequently, the exposure energy Eng taking proximity exposure effect into account will be of a suitable level for development, even at the pattern end sections, as shown in the diagram, and hence exposure shortage at the pattern end section will be eliminated. Therefore, supplementary exposure patterns in the regions of the patterns P1 and P2 become unnecessary, and hence it is possible to reduce the number of supplementary exposure patterns. According to the plan view on the left-hand side of FIG. 11B, a supplementary exposure pattern Qs is only provided in two of the correction areas in pattern P3.

Desirably, the shape of the divided patterns is such that the divided patterns are small in the end sections and become larger towards the central region, in accordance with the distribution of supplementary quantity of exposure Qs shown in FIG. 11A. Thereby, the change in the corrected main quantities of exposure Qm1, Qm2, Qm3 can be made to progress swiftly at the end sections and more gradually towards the central region. In other words, it is possible to assign the supplementary quantity of exposure of the supplementary exposure pattern as the main quantity of exposure Qm1, Qm2, without alteration, to the new patterns P1, P2 generated by division, and hence unnecessary generation of supplementary exposure patterns can be suppressed.

Desirably, the unit of pattern division is, for example, an integral factor of the size of the correction areas, this factor gradually becoming larger from the end sections towards the central region. For instance, the pattern areas gradually become larger in such a manner that they occupy one correction area at the end sections, then two correction areas at the next, and then three correction areas at the central. Alternatively, they may be increased according to a geometric series ($2^0, 2^1, 2^2, \ldots 2^n$), using the size of one correction area as the initial term.

By dividing the pattern using the size of the correction areas as a unit, and generating a divided pattern P2 corresponding to a plurality of correction areas, in many cases, the reduction in the supplementary exposure patterns generated is greater than the increase in the number of patterns caused by this division process. In other words, as illustrated by the plan view on the left-hand side of FIG. 11B, although the number of patterns P1, P2 increases due to division, the number of supplementary exposure patterns is reduced by three correction areas, and hence in total the number of patterns is reduced by one (increase of 2 and reduction of 3). In this case, this is because the divided pattern P2 is the size of two correction areas. If all of the divided patterns are the size of one correction area, then pattern division will not bring any reduction in overall number of patterns.

Desirably, pattern division is performed in the longitudinal direction only. In the case of long pattern, such as line and space patterns, in particular, as illustrated in FIG. 10, supplementary exposure patterns are normally generated only at either end section of the pattern. Therefore, by dividing the end sections to form separate patterns, it is possible to reduce the number of supplementary exposure patterns. If the pattern is also divided in the shorter direction thereof, then the number of patterns will increase due to the division, the number of supplementary exposure patterns will not decrease, and hence becoming ineffective.

Figure 12:
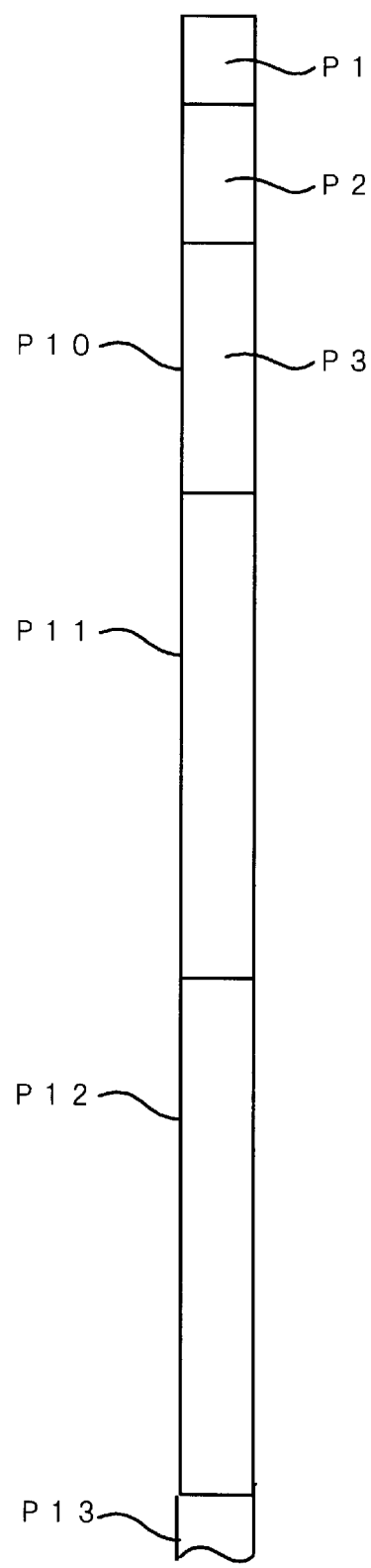
FIG. 12 is a diagram illustrating a dividing method in the case of adjacent patterns.

FIG. 12 is a diagram showing a division method in the case of adjacently positioned patterns. In this case, the design data is constituted by a plurality of adjacent patterns P10, P11, P12, P13 corresponding to a single continuous pattern, as illustrated in FIG. 12. Here, there is no need to divide up the patterns P10–P13, respectively. Of the plurality of adjacent patterns, the front ends of the respective end patterns P10 should be divided to form patterns P1 and P2. There is little probability of a supplementary exposure pattern being generated at either end of the patterns P11, P12, and hence it is possible to avoid excessive increase in the number of patterns due to pattern division.

[Pattern amendment]

FIG. 13 is a diagram describing pattern amendment. The shape of an electron beam, which is one type of charged particle beam, tends to enlarge due to Coulomb interaction between electrons. This blurring of the beam δ is directly proportional to the current density J and the pattern surface area S. In other words, $\delta = k \cdot J \cdot S$. The larger the current density J, the greater the reactive force between the electrons, and hence, the larger the beam size. Furthermore, as the beam size itself becomes larger, so the enlargement rate increases. The blurring of the beam δ is more accurately called exposure intensity distribution. The distribution is expanded by the Coulomb interaction.

Conventionally, since pattern dimensions have been relatively large, it has not been necessary to take blurring of the beam due to Coulomb interaction into account. Alternatively, if it has been taken into account, the blurring of the beam is inferred from the surface area S of the design pattern and the current density J set in the exposure device, the pattern being amended such that the pattern is reduced in size accordingly. However, when the pattern dimensions reach the order of 0.1 μm, the enlargement of the pattern due to blurring of the beam can no longer be ignored.

Therefore, in the present embodiment, when drawing a design pattern by means of a rectangular beam, the pattern is divided up hypothetically according to the rectangular drawing beam, and the blurring of the beam is determined from the drawing beam size having the largest surface area of these drawing beams. The pattern is then amended for reduction in accordance with this determined blurring of the beam.

Figure 13A:
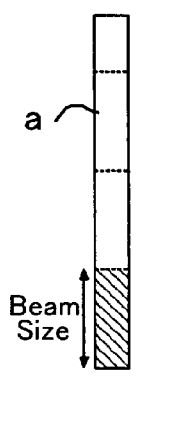
FIG. 13 is a diagram describing amendment of patterns.
Figure 13B:
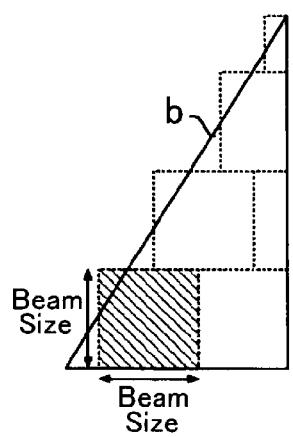
Figure 13C:
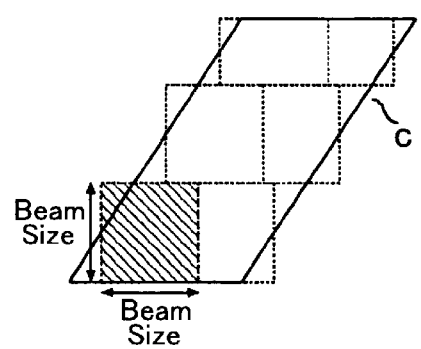

FIG. 13A, 13B, 13C show three patterns a, b and c. Pattern a is long and narrow, but when divided up according to the drawing beam, it is as illustrated in the diagram. Therefore, the amount of pattern reduction is determined according to the drawing beam size of the obliquely shaded section. Pattern b has a triangular shape, but it is drawn by six variable rectangular beams. Consequently, the amount of pattern reduction is determined according to the drawing beam size indicated by the oblique shading. Pattern c is a trapezoid shape that is larger than pattern b. However, the maximum size of the drawing beam sizes for drawing pattern c is the same shaded section as in pattern b. Therefore, the amount of blurring of the beam for pattern c will be the same as the amount of blurring of the beam for pattern b. As a result, the amount by which pattern c is reduced is the same as that for pattern b.

As shown in FIG. 5, the pattern amendment step S14 is performed after pattern division. This pattern amendment step reduces the size of the design pattern in accordance with the drawing beam size. Therefore, even if the size of the drawing beam increases due to Coulomb interaction, the pattern shape after exposure and development will be approximate to the shape of the design pattern, and hence any decline in pattern accuracy due to Coulomb interaction can be avoided.

[Quantity of exposure correction]

FIG. 14 is a diagram describing quantity of exposure correction in the present embodiment. FIG. 14A shows a comparative example 1 and FIG. 14B shows a comparative example 2. These examples depict quantity of exposure correction for a relatively large pattern P20, wherein a plurality of correction areas are formed in both the lateral direction and longitudinal direction thereof. As stated previously, quantity of exposure correction is a step that involves correcting the main quantity of exposure supplied to a pattern, in accordance with the pattern area density, which is represented by the corrected pattern density of the correction areas in the pattern.

In this case, a problem is which corrected pattern density for the correction areas within the pattern, or the like, is used as a reference. In comparative example 1, of the correction areas within the pattern P20, the correction area having the highest corrected pattern density is used as a reference when performing quantity of exposure correction. In this case, in the relatively large pattern P20, as illustrated on the left-hand side of the diagram, it can generally be considered that the corrected pattern density SR1 in the correction area CA1 in the central portion of the pattern is highest, whilst the pattern density SR2 of the correction area CA2 in the centre of one boundary edge of the pattern is lower, and the pattern densities SR3, 4 of the correction areas CA3, 4 at the corner regions of the patterns are the lowest. In comparative example 1, the main quantity of exposure is corrected with reference to the highest corrected pattern density of the correction areas in the pattern.

Therefore, the corrected main quantity of exposure is low and if the pattern P20 is exposed using this low main quantity of exposure, then quantity of exposure shortages will arise in the correction areas in the vicinity of the pattern boundaries. Consequently, as illustrated by the oblique shading in the right-hand diagram, supplementary exposure patterns are required about the whole perimeter of the pattern P20.

The method used in comparative example 1 at the least prevents the main quantity of exposure from becoming excessive and hence, the developed pattern from becoming thicker than the design values, by amending the main quantity of exposure with reference to the highest corrected pattern density within the pattern. However, in a comparatively large pattern, as stated above, supplementary exposure patterns are required in the vicinity of the pattern boundaries.

Comparative example 2 is a method according to the present embodiment, wherein the main quantity of exposure is corrected by taking the highest corrected pattern density of the correction areas at the boundaries of the pattern P20 as a reference area. In the example shown in FIG. 14B, of the 16 correction areas positioned at the boundaries of the pattern P20, the central correction area CA2 on one side thereof has the highest corrected pattern density, and hence this pattern density is used as a reference when correcting the main quantity of exposure. As a result, the main quantity of exposure is optimized in the region of the correction area CA2, and therefore it is not necessary to generate supplementary exposure patterns in these regions. Moreover, in the correction area CA1 in the central portion of the pattern P20, the quantity of exposure will become excessive, but since this area is centrally positioned, this will not lead to enlargement of the actual pattern. Ultimately, a quantity of exposure shortage will arise in the correction areas CA3, 4 at the corner regions of the pattern P20, and as shown by the oblique shading in the right-hand diagram, supplementary exposure patterns are generated for these regions only.

As a comparison between comparative example 1 and comparative example 2 clearly shows, if the pattern density of the correction area CA1 in the centre of the pattern is used as a reference when correcting the quantity of exposure, a large number of supplementary exposure patterns will be needed, whereas if the pattern density of the correction area CA2 at the pattern boundary is used as a reference, then only a small number of supplementary exposure patterns will be needed. In other words, in the step for correcting the main quantity of exposure, using the pattern density of the correction areas at the pattern boundaries, which have the greatest effect on the pattern shape, as a reference makes it possible to prevent enlargement of the pattern due to excessive exposure, and contributes towards reducing the number of supplementary exposure patterns.

Figure 15:
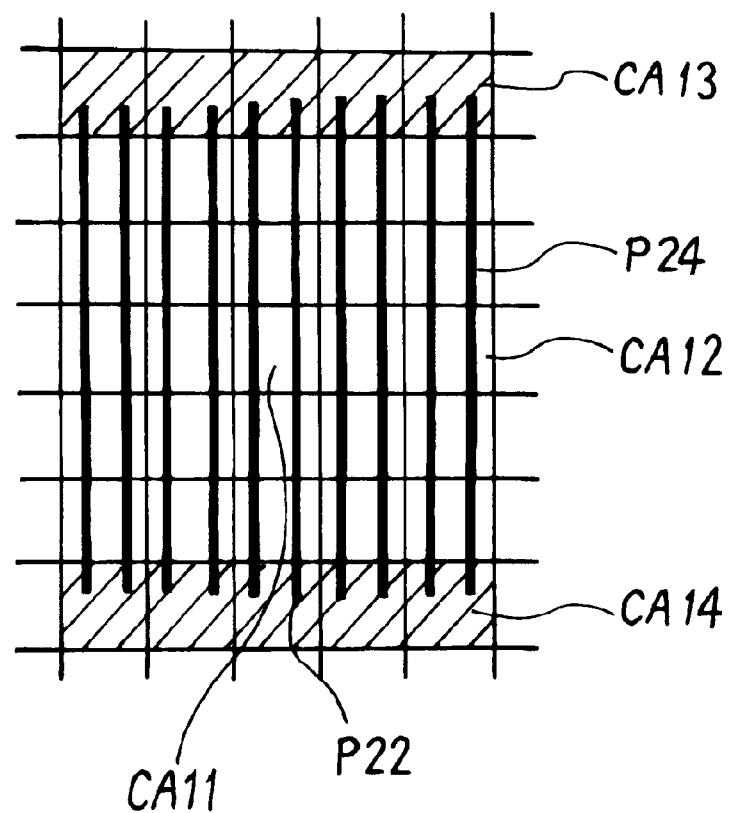
FIG. 15 is a diagram describing quantity of exposure correction for a line and space type of pattern.

FIG. 15 is a diagram illustrating quantity of exposure correction in a line and space pattern wherein long and narrow patterns are disposed at prescribed intervals. In the example in FIG. 15, ten line-shaped patterns are disposed, being separated by uniform spaces. In this case also, correction areas are generated, the pattern density of each correction area is determined and corrected to account for proximity exposure effects, and the main quantity of exposure is corrected with reference to the highest corrected pattern density (the pattern area density) of the correction areas in the pattern.

In the ten patterns in FIG. 15, the corrected pattern density is highest in correction area CA11, the corrected pattern density is lower in correction area CA12 at the boundary region of the pattern group, and the corrected pattern density is lowest in correction areas CA13 and 14 in the corner regions of the pattern group.

If the reference area for quantity of exposure correction is taken as the correction area having the highest corrected pattern density of the correction areas intersecting with the pattern boundaries, as described above, then in the centrally located pattern P22, the correction area CA11 in the centre thereof has the highest corrected pattern density, and hence this is used as a reference to correct the main quantity of exposure of the pattern P22. Similarly, in the edge pattern P24 also, the central correction area CA12 has the highest corrected pattern density, and hence this is used as a reference to correct the main quantity of exposure for the pattern P24. In this case, since the corrected pattern density of correction area CA12 is lower than that of the central correction area CA11, the main quantity of exposure for pattern P24 will be corrected in such a manner that it is greater than the main quantity of exposure for the central pattern P22.

In either case, in both patterns P22 and P24, respectively, the main quantity of exposure is corrected to an optimal value, and hence supplementary exposure patterns for compensating for the shortages of exposure are generated in the correction areas CA13, 14 at the top and bottom edges of the pattern, as illustrated by the oblique shading in the diagram.

As in FIG. 15, if the pattern width is narrower than the correction areas, then similar effects to the foregoing can be obtained, even if the main quantity of exposure of the pattern is corrected with reference to the highest corrected pattern density of the correction areas within the pattern. However, as in FIG. 14, in case that a plurality of correction areas are covered by the width and height of the pattern, if quantity of exposure correction is performed with reference to the highest corrected pattern density of the correction areas within the pattern, and the number of corrected exposure patterns will increase as in comparative example 1. Therefore, as in comparative example 2, the number of corrected exposure patterns can be reduced by performing quantity of exposure correction with reference to the highest corrected pattern density of the plurality of correction areas adjacent to the boundaries of the pattern (the boundary between the exposed regions and the non-exposed regions, namely, the exposure boundary).

As described above, since the main quantity of exposure is determined with reference to the highest corrected pattern density of the correction areas at the boundaries of the pattern, the number of regions having a shortage of exposure at the pattern boundaries is reduced, and hence the number of supplementary exposure patterns can also be reduced. Moreover, by limiting the correction areas used for reference to those at the boundaries of the pattern, it is possible to reduce the calculation load involved in quantity of exposure correction. Moreover, by limiting the reference areas for quantity of exposure correction to those at the boundaries of the pattern, it is possible to apply correction in a general manner, both in cases where the shape of the pattern is large, as in FIG. 14, and in cases where it is narrow, as in FIG. 15.

Figure 16:
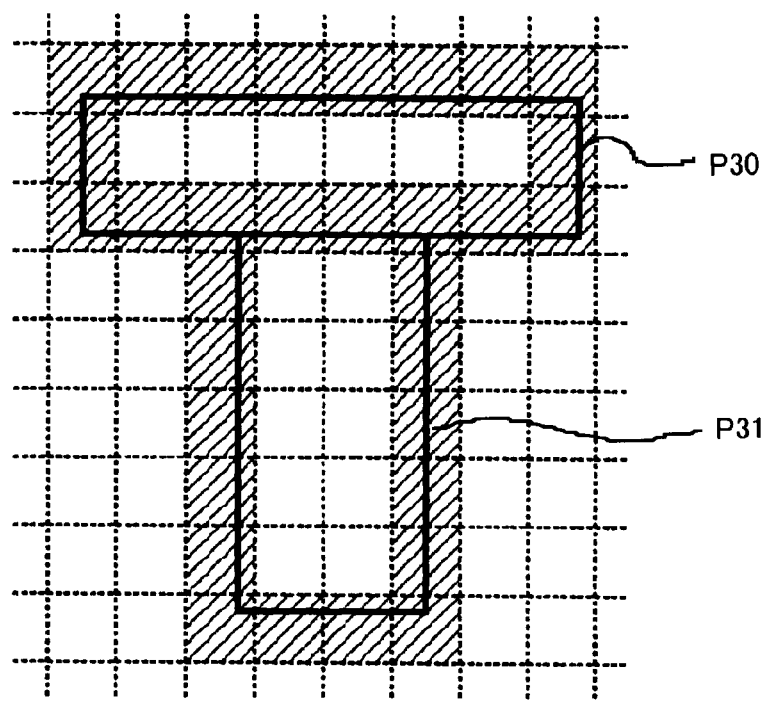
FIG. 16 is a diagram describing a method for detecting correction areas situated on an exposure boundary.

If the aforementioned quantity of exposure correction algorithm is adopted, it is necessary to detect the correction areas that intersect with the pattern boundaries. FIG. 16 is a diagram illustrating a method for detecting correction areas at the exposure boundaries. FIG. 16 depicts an example involving two connected patterns P30 and P31. Usually, a design pattern is rectangular and is defined in terms of its width and height, and therefore the T-shaped pattern shown in FIG. 16 is divided into two patterns P30, P31.

In the first example of detecting the correction areas intersecting with the boundaries of the patterns, the pattern density for a certain pattern is detected in the correction areas intersecting with that pattern, and if that pattern density is less than 100%, then the correction area is judged to be a correction area which intersects with the boundary of the pattern. In other words, a simple pattern edge is regarded to be a pattern boundary, regardless of the presence of patterns surrounding same. By means of this method, all of the correction areas on the boundaries of the pattern P30 are judged to be on boundary and all of the correction areas on the boundaries of the pattern P32 are judged to be on boundary. Therefore, the detected correction areas on the exposure boundaries are the areas indicated by the oblique shading in the diagram.

This detection algorithm is simply able to find and judge the pattern density within the correction areas of a desired pattern, and therefore the calculation involved is simple and the calculation processing load is light. However, the region where patterns P30 and P31 connect is also detected as correction areas located on a boundary.

Figure 17:
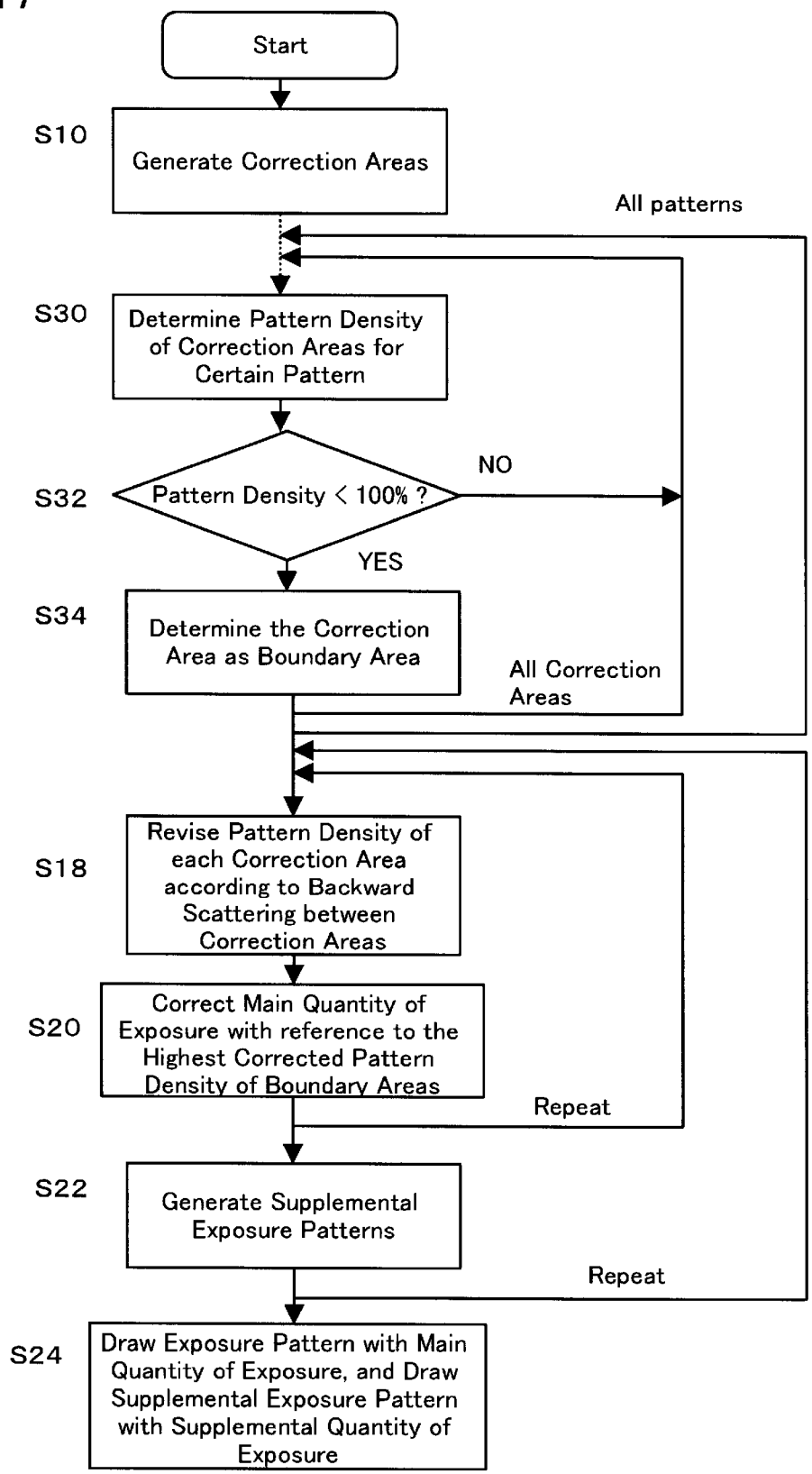
FIG. 17 is a flowchart of exposure steps including a step for determining correction areas situated on boundaries.

FIG. 17 is a flowchart of an exposure step including steps for determining correction areas on boundaries according to the first example described above. The same steps as those in FIG. 5 are labelled with the same numbers. In FIG. 17, at step S30, the pattern density of a correction area for a certain pattern is determined, at step S32, if this pattern density is less than 100%, then that correction area is taken as a boundary area (S34). These steps S30, S32, S34 are carried out for all of the correction areas in the pattern. Furthermore, these steps are carried out for all of the patterns. Consequently, as illustrated in FIG. 16, it is possible to detect all of the boundary areas in the patterns.

The process of correcting the pattern density of a correction area, with respect to proximity exposure effects, in step S18 is the same as that in FIG. 5. However, in step S20, the main quantity of exposure is corrected with reference to the highest corrected pattern density of the boundary areas.

Desirably, steps S18 and S20 are repeated until convergence is achieved. Furthermore, after the quantity of exposure has been corrected and the main quantity of exposure for the pattern has been determined, at step S22, supplementary exposure patterns are generated for correction areas where there is a shortage in the quantity of exposure.

Figure 18:
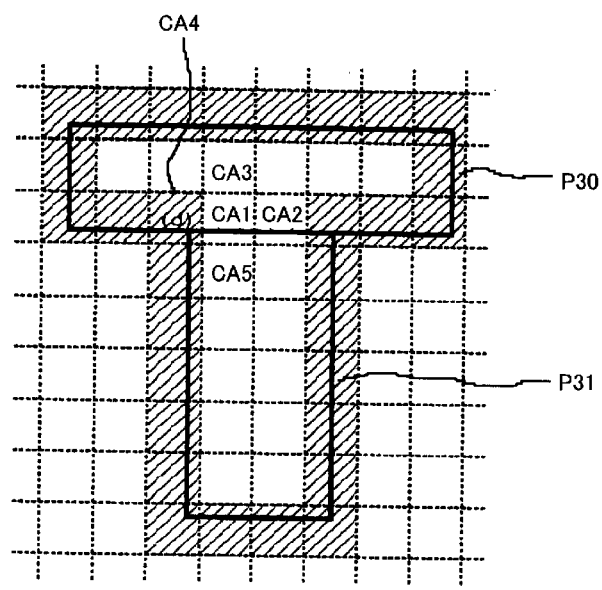
FIG. 18 is a diagram describing a second example of determining correction areas situated on pattern boundaries.

FIG. 18 is a diagram describing a second example of determining correction areas at the boundaries of a pattern. The second example is a method for determining correction areas on the boundaries of a pattern, taking the other adjacent patterns into account. In other words, of the correction areas intersecting with pattern P30, the correction areas CA1, CA2 that also intersect with the pattern P31 are not regarded as correction areas located on a boundary.

More specifically, the pattern density of each correction area is determined by taking all of the patterns into account, and if this pattern density is 100% and there are no correction areas having a pattern density of 0% located adjacently to this correction area, then this correction area is not regarded as a correction area located on a boundary. Stated differently, if there is a correction area having a pattern density of 0% located adjacently to the correction area in question, then the area will be judged to be a correction area intersecting with a boundary. According to this algorithm, the correction areas CA1, CA2 are excluded from the boundary areas, and hence a more optimized boundary area detection method is achieved.

As stated in the foregoing, the main quantity of exposure for each pattern is determined in accordance with the highest corrected pattern density of the boundary areas, as determined in this manner.

[Block masks]

Direct fabrication by electron beam exposure leads to a decline in throughput, due to the increase in the number of exposure shots. The reason for this is that, a rectangular beam of a desired size is generated by superimposing two rectangular transmission masks of a prescribed size, and this rectangular beam is used for drawing. In order to prevent decline in throughput of this kind, a block mask is proposed.

Figure 19:
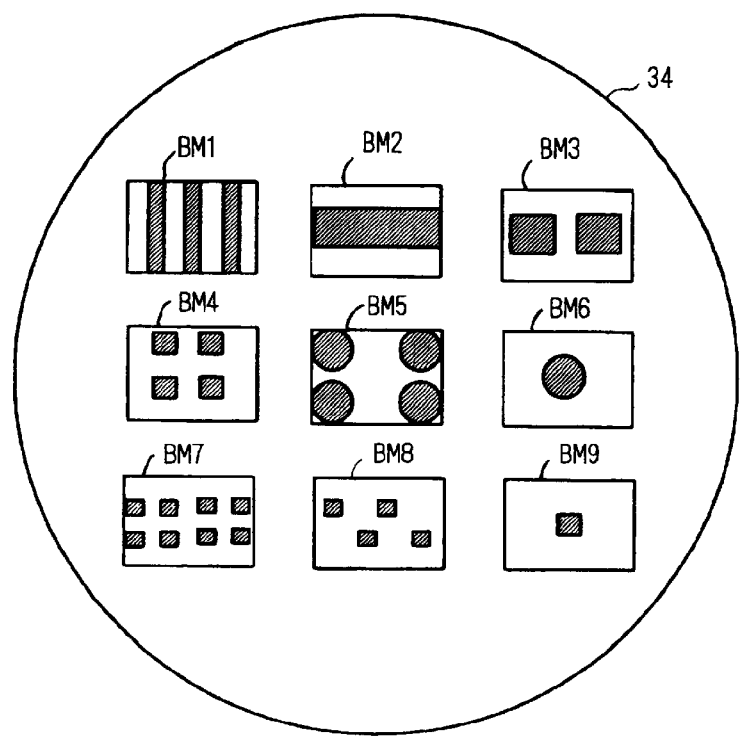
FIG. 19 is a diagram illustrating one example of a block mask.

FIG. 19 is a diagram illustrating one example of a block mask. A block mask as shown in FIG. 19 is used as the transmission mask 34 shown in FIG. 1. The block mask 34 is a mask previously prepared with patterns BM1–BM9 of high use frequency as transmission masks. By irradiating an electron beam through these patterns, a special pattern can be exposed in a single shot. Therefore, it is possible to reduce the number of shots and hence the throughput of the whole exposure step is improved.

A characteristic feature of a block mask of this kind is that only the same main quantity of exposure can be given to a single block mask BM. Therefore, a problem arises with regard to how to determine a main quantity of exposure for the block mask.

Figure 20:
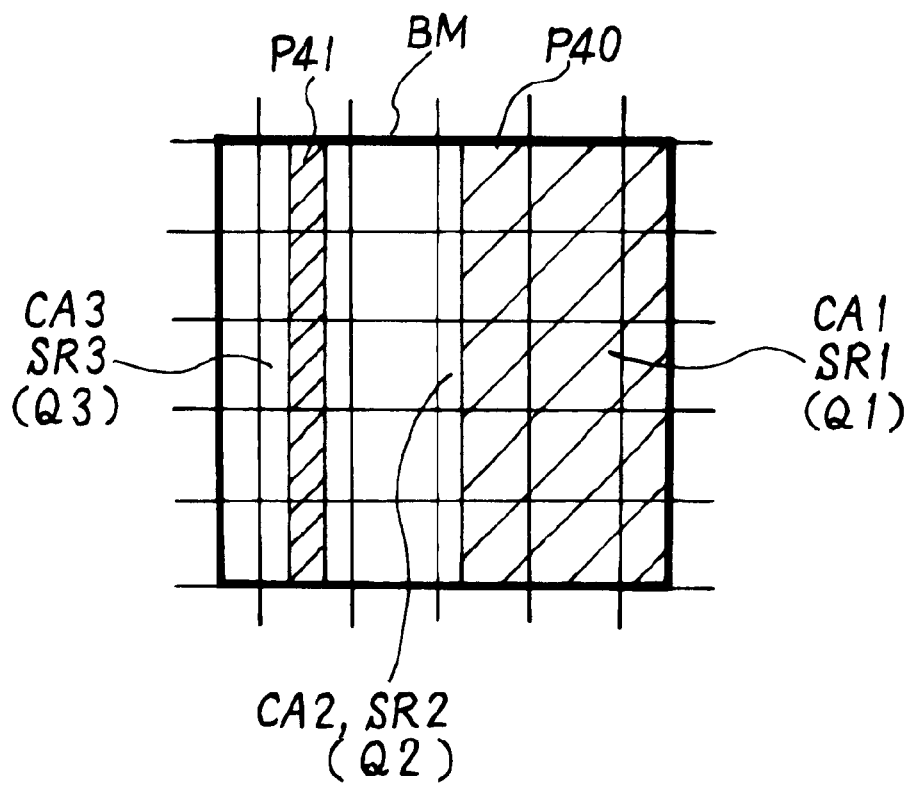
FIG. 20 is a diagram describing a method for determining a main quantity of exposure of a block mask in the present embodiment.

FIG. 20 is a diagram illustrating a method for determining a main quantity of exposure for a block mask according to a present embodiment. In the present embodiment, if the block mask BM contains a plurality of patterns P40, P41, then as stated previously, correction areas are generated, the pattern density of these correction areas is determined, these pattern densities are corrected by taking proximity exposure effects into account, and the main quantities of exposure for each pattern P40, P41 are corrected in accordance with the maximum value of the corrected pattern densities for the correction areas at the boundaries of the pattern. The minimum quantity of exposure of the corrected quantities of exposure for the plurality of patterns contained in the block mask BM is set as the quantity of exposure for the block mask.

According to the aforementioned algorithm, in the example in FIG. 20, correction of the quantity of exposure for the pattern P40 is performed on the basis of the corrected pattern density SR2 of the correction area CA2 at the pattern boundary. On the other hand, the correction of the quantity of exposure for the pattern P41 is performed on the basis of the corrected pattern density SR3 for the correction area CA3 at the pattern boundary. Consequently, the corrected quantity of exposure Q2 of the pattern P40 is expected to be greater than the corrected quantity of exposure Q3 of the pattern P41. This is because the correction area CA3 of the pattern P41 has a lower density. Therefore, in this case, the main quantity of exposure of the block mask BM will be the corrected quantity of exposure Q3 of the pattern P41, which is the smaller. Supplementary exposure patterns are generated in the correction areas within the block mask BM where a quantity of exposure shortage arises.

In the diagram, the corrected quantity of exposure Q1 referenced to the pattern density SR1 of the correction area CA1 in the central portion of the pattern P40 is the lowest quantity of exposure, and it is predicted that, if this is set as the quantity of exposure of the block mask, then the number of supplementary exposure patterns will increase.

In the aforementioned embodiment, quantity of exposure correction is performed, and supplementary exposure patterns are generated in all of the correction areas in the pattern where there is a shortage of exposure energy with the corrected main quantity of exposure. In this case, the supplementary quantity of exposure for the supplementary exposure patterns is determined from the relationship between the main quantity of exposure and the corrected pattern density. It is possible to devise that, if this supplementary quantity of exposure is less than a reference value, then the corresponding supplementary exposure pattern is not generated. Thereby, it is possible to restrict further the number of supplementary exposure patterns.

According to the present invention, it is possible to reduce, as far as possible, generation of supplementary exposure patterns, thereby increasing the throughput of the exposure step, and making the pattern shape after exposure and development more sharply defined. Furthermore, it is also possible sufficiently to prevent enlargement of the beam size due to Coulomb interaction. Furthermore, block mask exposure can be performed in a suitable manner.

What is claimed is:

1. A charged particle beam exposure method, wherein exposure data having exposure pattern data is generated from pattern data having a plurality of patterns, and a material is exposed in accordance with said exposure data; comprising the steps of:

(a) generating a plurality of correction areas with respect to said patterns;

(b) dividing a pattern of said pattern data, which is long and narrow and has a height to width ratio greater than a reference value, into a plurality of patterns;

(c) determining a pattern area density within said correction areas, and revising the pattern density of the correction area in accordance with the pattern densities of correction areas surrounding said correction area and a distance between the respective correction areas;

(d) determining a main quantity of exposure for each divided pattern in accordance with the highest corrected pattern density of said corrected pattern densities of the correction areas intersecting with said divided pattern;

(e) generating supplementary exposure patterns in said correction areas within said divided patterns where there is a shortage of exposure energy in the case of said main quantity of exposure; and (f) exposing said material, in accordance with exposure pattern data comprising said supplementary exposure patterns added to said pattern data.

2. The charged particle beam exposure method according to claim 1, wherein, in step (b), said pattern is divided only in the direction of the longer dimension thereof.

3. The charged particle beam exposure method according to claim 1, wherein, in step (b), said divided patterns have a unit size of the size of said correction areas.

4. The charged particle beam exposure method according to claim 3, wherein, in step (b), the size of said divided patterns increases gradually and successively from end sections of said pattern toward a central section of said pattern.

5. The charged particle beam exposure method according to claim 1, wherein, in step (b), when a plurality of patterns are disposed in mutually connecting fashion in a single line, the patterns at either end of the plurality of patterns disposed in said line are divided.

6. A charged particle beam exposure method, wherein exposure data having exposure pattern data is generated from pattern data having a plurality of patterns, and a material is exposed in accordance with said exposure data; comprising the steps of:

(a) determining blurring of the beam due to spreading of said beam according to the maximum size of the exposure beam size used to draw said pattern, and amending said pattern to be reduced in accordance with said blurring of the beam; and (b) exposing said material in accordance with exposure pattern data determined in accordance with said amended pattern.

7. A charged particle beam exposure method, wherein exposure data having exposure pattern data is generated from pattern data having a plurality of patterns, and a material is exposed in accordance with said exposure data; comprising the steps of:

(a) generating a plurality of correction areas with respect to said patterns;

(b) determining a pattern area density within said correction areas, and revising the pattern area density of said correction area in accordance with the pattern area densities of correction areas surrounding said correction area and a distance between the respective correction areas;

(c) determining a main quantity of exposure for each pattern in accordance with the highest corrected pattern area density of said corrected pattern area densities of the correction areas intersecting with the boundaries of said pattern;

(d) generating supplementary exposure patterns in said correction areas within said patterns where there is a shortage of exposure energy in the case of said main quantity of exposure; and (e) exposing said material, in accordance with exposure pattern data comprising said supplementary exposure patterns added to said pattern data.

8. The charged particle beam exposure method according to claim 7, wherein, in step (c), correction areas intersecting with respective boundaries of said patterns are detected and main quantities of exposure for each of said patterns are determined in accordance with the highest corrected pattern area density of said detected correction areas.

9. The charged particle beam exposure method according to claim 7, wherein, in step (c), correction areas intersecting with respective boundaries of said patterns and having a correction area of zero pattern area density surrounding said correction area at the boundary are detected, and main quantities of exposure for each of said patterns are determined in accordance with the highest corrected pattern area density of said detected correction areas.

10. A charged particle beam exposure method for exposing a material by means of a charged particle beam transmitted through a block mask having a plurality of patterns, comprising the steps of:

(a) generating a plurality of correction areas with respect to the patterns of said block mask;

(b) determining a pattern area density within said correction areas, and revising the pattern area density of the correction areas in accordance with the pattern area densities of correction areas surrounding said correction area and a distance between the respective correction areas;

(c) determining quantities of exposure for each pattern in accordance with the highest corrected pattern area density of said corrected pattern densities of the correction areas intersecting with the boundaries of said patterns, and setting the smallest quantity of exposure among the quantities of exposure for the plurality of patterns within said block mask as the main quantity of exposure for said block mask;

(d) generating supplementary exposure patterns in said correction areas within said patterns where there is a shortage of exposure energy in the case of said main quantity of exposure; and (e) exposing said material in accordance with said main quantities of exposure by means of a charged particle beam passing through said block mask, and, further, exposing said material according to said supplementary exposure patterns.

* * * * *